United States Patent
Hatano et al.

(10) Patent No.: US 7,192,852 B2
(45) Date of Patent: Mar. 20, 2007

(54) METHOD FOR FABRICATING IMAGE DISPLAY DEVICE

(75) Inventors: Mutsuko Hatano, Kokubunji (JP); Shinya Yamaguchi, Mitaka (JP); Takeo Shiba, Kodaira (JP); Mitsuharu Tai, Kokubunji (JP); Hajime Akimoto, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/172,958

(22) Filed: Jul. 5, 2005

(65) Prior Publication Data

US 2005/0244996 A1 Nov. 3, 2005

Related U.S. Application Data

(63) Continuation of application No. 10/602,738, filed on Jun. 25, 2003, now Pat. No. 6,949,452.

(30) Foreign Application Priority Data

Jul. 24, 2002 (JP) ............................. 2002-215239

(51) Int. Cl.
*H01L 21/20* (2006.01)
(52) U.S. Cl. ................................ 438/488; 257/E21.324
(58) Field of Classification Search ................ 438/488; 257/E21.324
See application file for complete search history.

(56) References Cited

U.S. PATENT DOCUMENTS 4,343,829 A 8/1982 Tochikubo et al.

(Continued)

FOREIGN PATENT DOCUMENTS

JP 2002-43222 2/1995

(Continued)

OTHER PUBLICATIONS

C.T. Angelis, C.A. Dimitriadis, M. Miyasaka, F.V. Farmakis, G. Kamarinos, J. Brini and J. Stoermenos, "Effect of Excimer Laser Annealing on the Structural and Electrical Properties of Polycrystalline Silicon Thin-Film Transistors", Journal of Applied Physics (Oct. 15, 1999), vol. 86, No. 8, pp. 4600-4606.

(Continued)

*Primary Examiner*—Michael Lebentritt
*Assistant Examiner*—Stanetta Isaac
(74) *Attorney, Agent, or Firm*—Reed Smith LLP; Stanley P. Fisher, Esq.; Juan Carlos A. Marquez, Esq.

(57) ABSTRACT

There is provided a method for fabricating an image display device having an active matrix substrate including high-performance transistor circuits operating with high mobility as drive circuits for driving pixel portions which are arranged as a matrix. The portion of a polysilicon film formed in a drive circuit region DAR1 provided on the periphery of the pixel region PAR of the active matrix substrate SUB1 composing the image display device is irradiated and scanned with a pulse modulated laser beam or a pseudo CW laser beam to be reformed into a quasi-strip-like-crystal silicon film having a crystal boundary continuous in the scanning direction so that discrete reformed regions each composed of the quasi-strip-like-crystal silicon film are formed. In virtual tiles TL composed of the discrete reformed regions, drive circuits having active elements such as thin-film transistors or the like are formed such that the channel directions thereof coincide with the direction of crystal growth in the quasi-strip-like-crystal silicon film.

23 Claims, 32 Drawing Sheets

U.S. PATENT DOCUMENTS

| | | |
|---|---|---|
| 6,071,765 A | 6/2000 | Noguchi et al. |
| 6,368,945 B1 | 4/2002 | Im |
| 6,509,212 B1 | 1/2003 | Zhang |
| 6,521,473 B1 | 2/2003 | Jung |
| 6,664,147 B2 | 12/2003 | Voutsas |
| 6,713,324 B2 | 3/2004 | Shiba et al. |
| 6,797,550 B2 | 9/2004 | Kokubo et al. |
| 2001/0026835 A1 | 10/2001 | Tanaka |
| 2002/0031876 A1 | 3/2002 | Hara et al. |
| 2002/0179589 A1 | 12/2002 | Morita et al. |
| 2003/0027410 A1 | 2/2003 | Matsumura et al. |
| 2003/0064571 A1 | 4/2003 | Takeda et al. |
| 2003/0068836 A1 | 4/2003 | Hongo et al. |
| 2003/0076023 A1 | 4/2003 | Komoda et al. |
| 2003/0160263 A1 | 8/2003 | Hiroshima |
| 2003/0166315 A1 | 9/2003 | Tanada et al. |
| 2003/0181043 A1 | 9/2003 | Tanada et al. |
| 2003/0227038 A1 | 12/2003 | Kikuchi et al. |

FOREIGN PATENT DOCUMENTS

| | | |
|---|---|---|
| JP | 2002-100637 | 2/1995 |

OTHER PUBLICATIONS

Hiroyuki Kuriyama, Tomoyuki, Nohda, Satoshi Ishida, Takashi Kuwahara, Shigeru Noguchi, Seiichi Kiyama, Shinya Tsuda and Shoichi Nakano, "Lateral Grain Growth of Poly-Si Films with a Specific Orientation by an Excimer Laser Annealing Method", Jpn. J. Appl. Phys., vol. 32 (1993), pp. 6190-6195.

Kenkichi Suzuki, Masakazu Saitou, Michiko Takahashi, Nobuaki Hayashi and Takao Terabayashi, "Correlation Between Power Density Fluctuation and Grain Size Distribution of Laser Annealed Poly-Crystalline Silicon", Part of the SPIE Conference on Laser Applications in Microelectronics and Optoelectronic Manufacturing IV, Jan. 1999, SPIE vol. 3618, pp. 310-319.

Stanley Wolf, Richard N, Tauber, "Silicon Processing for the VLSI Era Process Technology", Lattice Press, vol. I, pp. 407-408.

FIG.10
(A)
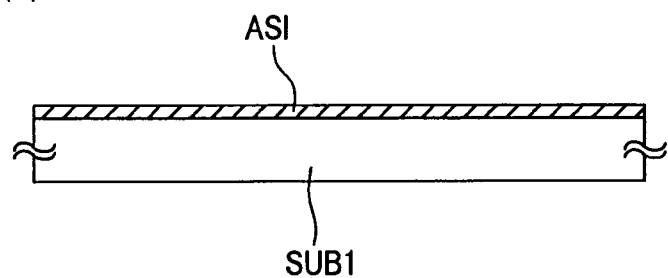
(B)
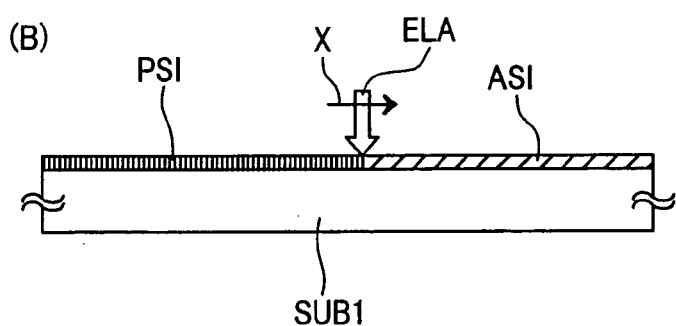
(C)
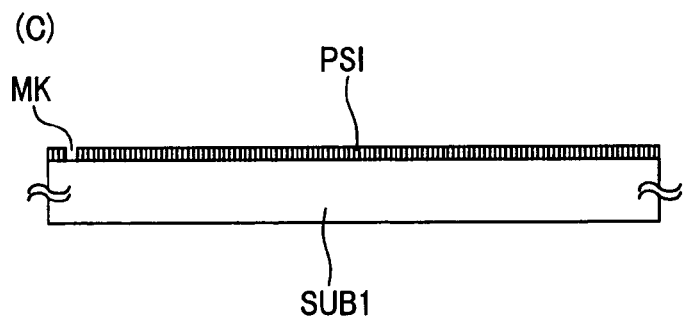

FIG.12
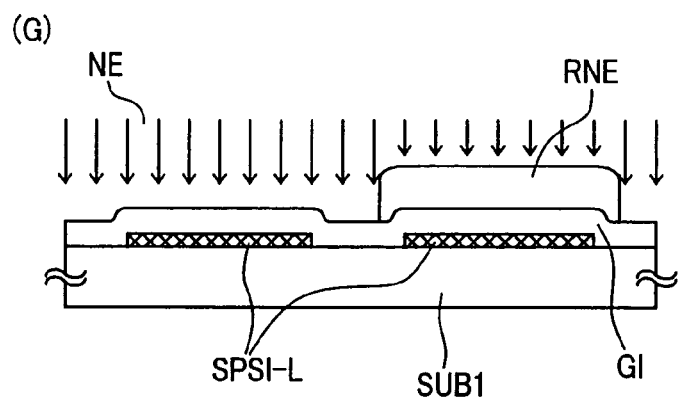
(G)
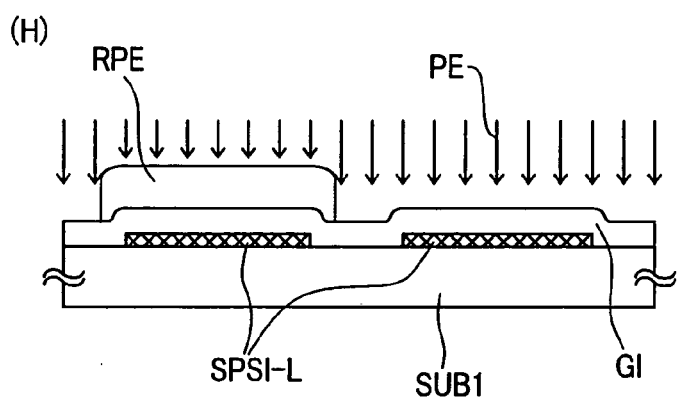
(H)
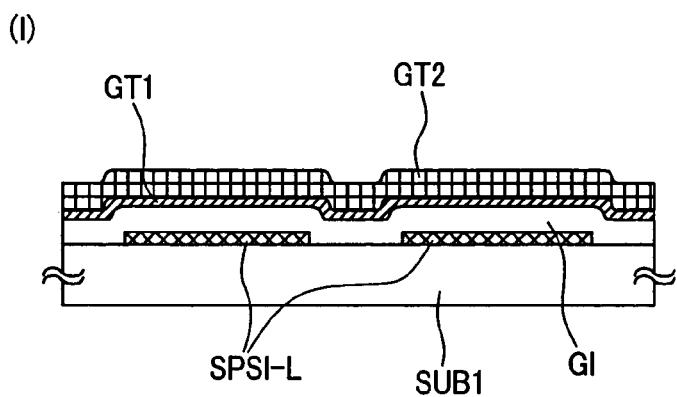
(I)

FIG.13
(J)
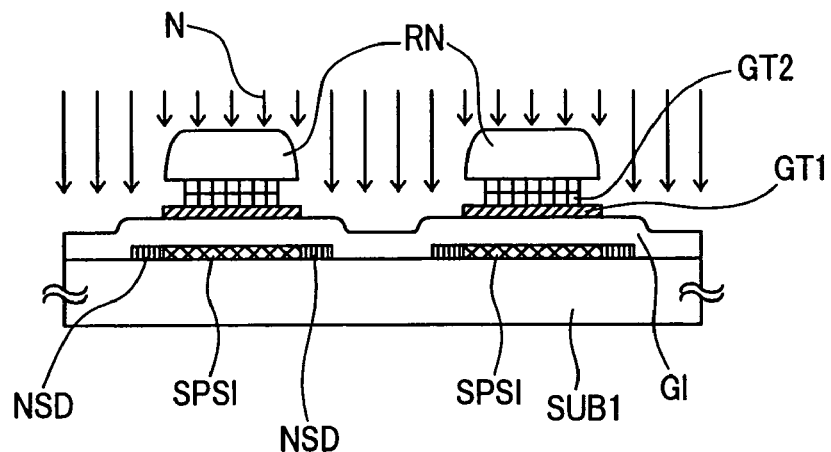
(K)
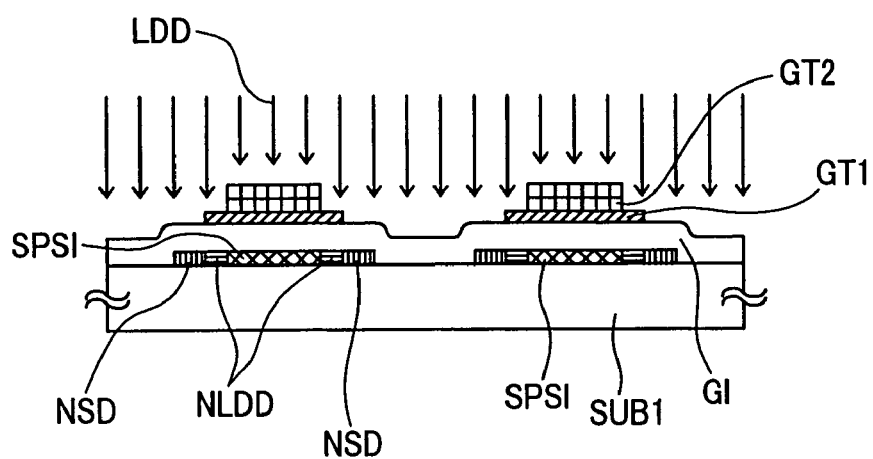

FIG.14
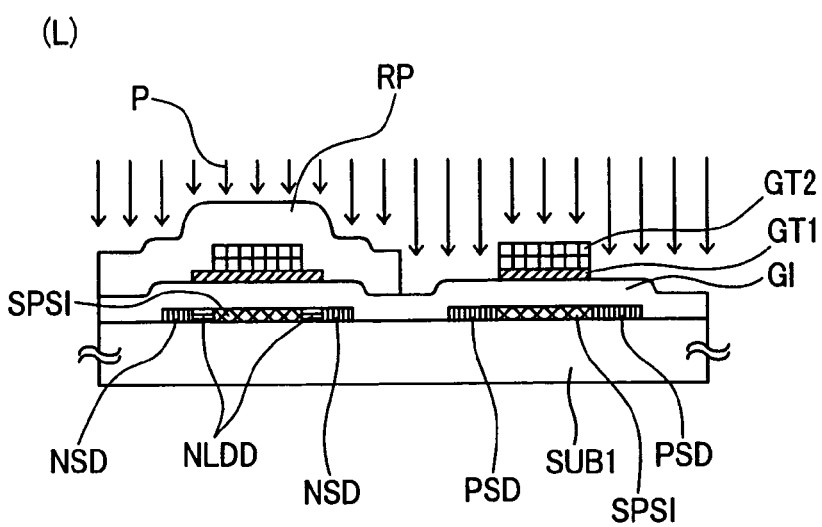
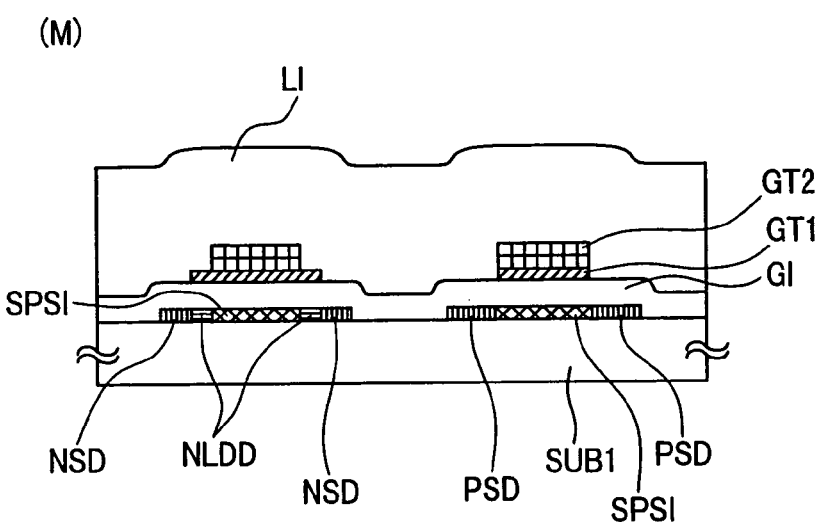

FIG.27
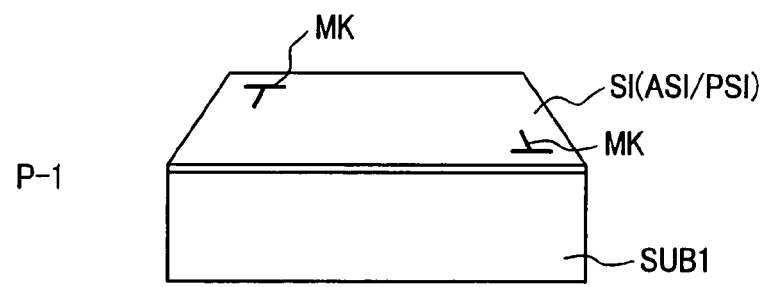
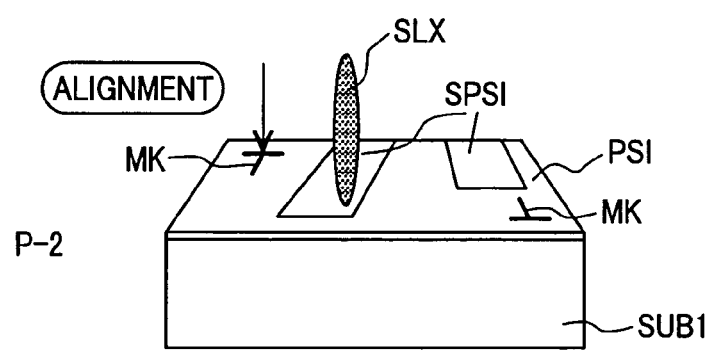
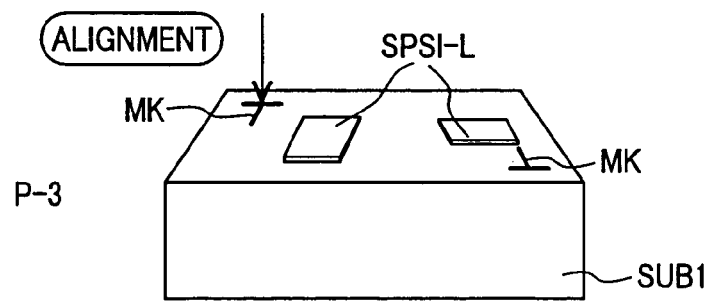

FIG.28
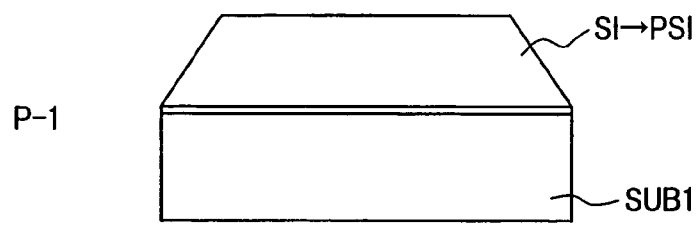
P-1
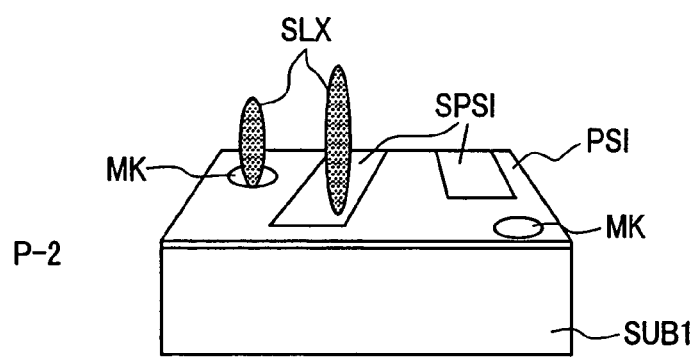
P-2
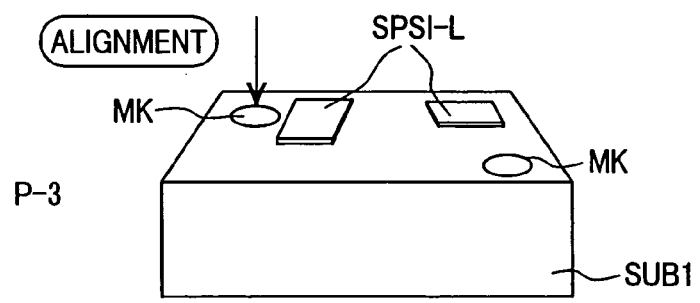
P-3

FIG.29
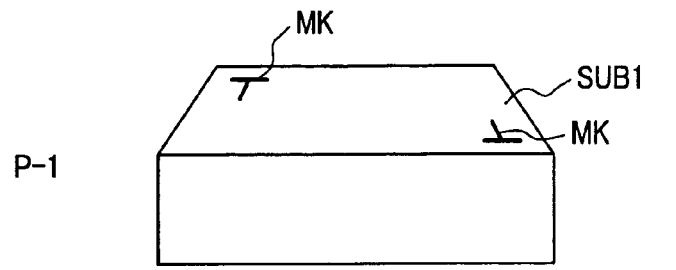
P-1
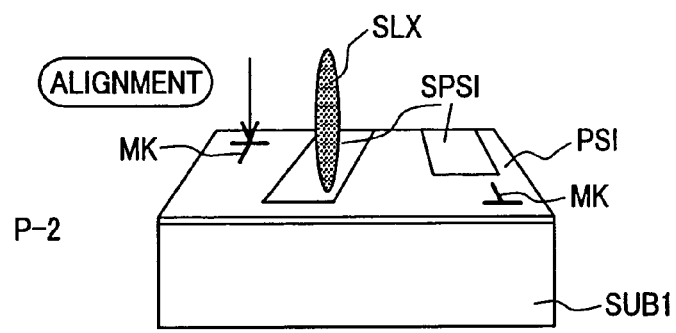
P-2
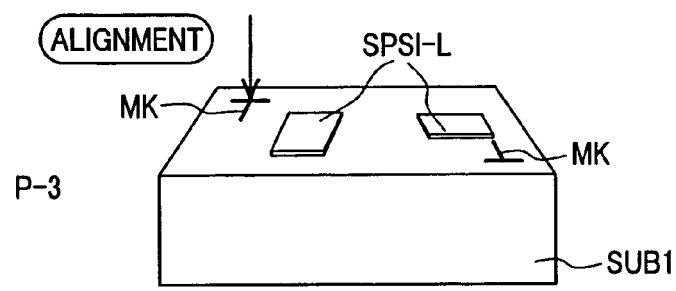
P-3

PSI

TRA

SD1, SD2, PSI-L, GT

METHOD FOR FABRICATING IMAGE DISPLAY DEVICE

This application is a Continuation application of U.S. application Ser. No. 10/602,738 filed on Jun. 25, 2003 now U.S. Pat. No. 6,949,452. Priority is claimed based upon U.S. application Ser. No. 10/602,738 filed on Jun. 25, 2003, which claims the priority date of Japanese Application No. 2002-215239 filed on Jul. 24, 2002, and which is hereby incorporated by reference.

BACKGROUND OF THE INVENTION

1. Field of the Invention

The present invention relates to an image display device and, more particularly, to a method for fabricating an image display device in which the crystal structure of a semiconductor film formed on an insulating substrate is reformed with a laser beam and active elements for a drive circuit are formed in the reformed semiconductor film.

2. Description of Related Art

An active matrix display device (which is also referred to as an image display device in an active matrix drive system or simply referred to as a display device) using active elements, such as thin-film transistors, as drive elements for pixels arranged as a matrix has been used widely. Most of image display device of this type are capable of displaying a high-quality image by disposing, on an insulating substrate, a large number of pixel circuits and drive circuits composed of active elements such as thin-film transistors (TFTs) which are formed by using a silicon film as a semiconductor film. By way of example, a description will be given to a thin-film transistor as a typical example of the active element.

It has been difficult to constitute a circuit on which high-speed and high-function requirements are placed by thin-film transistors each using a non-crystalline silicon semiconductor film (an amorphous silicon semiconductor film) that has thus far been used commonly as a semiconductor film because the performance of the thin-film transistors represented by carrier (electron or hole) mobility is limited. It is effective in implementing a thin-film transistor with high mobility required to provide a higher-quality image to preliminarily reform (crystallize) an amorphous silicon film (hereinafter also referred to as a non-crystalline silicon film) into a polysilicon film (hereinafter also referred to as a polycrystalline silicon film) and form the thin-film transistor by using the polysilicon film. For the reformation, technology which anneals the amorphous silicon film by irradiating it with a laser beam, such as an excimer laser beam, has been used.

This type of technology associated with laser annealing is described in detail in a paper such as: T. C. Angelis et al., "Effect of Excimer Laser Annealing on the Structural and Electrical Properties of Polycrystalline Silicon Thin-Film Transistor," J. Appl. Phy., Vol. 86, pp. 4600–4606, 1999; H. Kuriyama et al., "Lateral Grain Growth of Poly-Si Films with a Specific Orientation by an Excimer Laser Annealing Method," Jpn. J. Appl. Phy., Vol. 32, pp. 6190–6195, 1993; or K. Suzuki et al, "Correlation between Power Density Fluctuation and Grain Size Distribution of Laser Annealed Poly-Crystalline Silicon," SPIE Conference, Vol. 3618, pp. 310–319, 1999.

A method for reforming an amorphous silicon film through crystallization by using irradiation with an excimer laser beam will be described with reference to FIGS. 34A and 34B. FIGS. 34A and 34B are views illustrating a commonest method for crystallizing the amorphous silicon film by scanning with the irradiation of an excimer pulse laser beam, of which FIG. 34A shows a structure of an insulating film formed with a semiconductor layer to be irradiated and FIG. 34B shows the state of reformation under the irradiation of the laser beam. For the insulating substrate, glass or ceramic is used.

In FIGS. 34A and 34B, an amorphous silicon film AS1 deposited on an insulating substrate SUB with an underlying film (SiN or the like, not shown) interposed therebetween is irradiated with a linear excimer laser beam ELA with a width in the range of several nanometers to several hundreds of nanometers. By moving the irradiation position in one direction (x direction) as indicated by the arrow for each pulse or each several pulses, the amorphous silicon film AS1 is scanned to be annealed, whereby the amorphous silicon film AS1 over the entire insulating substrate SUB is reformed into a polysilicon film PS1. Various processes including etching, wire formation, and ion implantation are performed with respect to the polysilicon film PS1 obtained as a result of reforming the amorphous silicon film AS1 by this method to form a circuit having active elements, such as thin-film transistors, in individual pixel portions or drive portions. The insulating substrate is used to fabricate an image display device in an active matrix system such as a liquid crystal display device or an organic EL display device.

FIGS. 35A and 35B are a partial plan view of a portion irradiated with the laser beam and a plan view of a principal portion of a thin-film transistor for illustrating an exemplary structure thereof. As shown in FIG. 35A, numerous crystallized silicon grains (polycrystalline silicon) ranging in size from 0.05 to 0.5 μm grow uniformly across the surface of the portion irradiated with the laser beam. Most of the crystal boundaries of the individual silicon grains (i.e., silicon crystals) are closed by themselves (the crystal boundaries are present between the silicon grains which are adjacent in each direction). The portion enclosed by the box in FIG. 35A forms a transistor portion TRA composed of a semiconductor film for active elements such as individual thin-film transistors. The conventional reformation of a silicon film indicates such crystallization.

To form a pixel circuit by using the foregoing silicon film (polysilicon film PSI) resulting from the reformation, etching is performed with respect to the crystallized silicon to use a portion thereof as the transistor portion and remove an unneeded portion thereof other than the portion serving as the transistor portion TRA shown in FIG. 35A, whereby an island of the silicon film is formed as shown in FIG. 35B. A thin-film transistor is fabricated by placing a gate insulating film (not shown), a gate electrode GT, a source electrode SD1, and a drain electrode SD2 on the resulting island PSI-L.

Although the foregoing prior art technology has formed the thin-film transistor on the insulating substrate by using the polysilicon film resulting from the reformation and thereby disposed an active element with excellent operational performance such as a thin-film transistor, the carrier mobility (the electron mobility or the hole mobility which will also be referred to simply as the electron mobility) in the channel of, e.g., a thin-film transistor using the crystal of a polysilicon film is limited, as stated previously. Specifically, since the crystal boundary of each of the particulate crystals in the polysilicon film that has been crystallized by the irradiation with the excimer laser beam is closed, as shown in FIGS. 34A and 34B, the achievement of a higher carrier mobility in the channel between the source and drain electrodes is limited. In addition, the circuit density of the drive circuit has also been increased with a recent trend toward higher definition. An active element such as a thin-film transistor in Such a drive circuit having an extremely high circuit density is requested to have a much higher carrier mobility.

SUMMARY OF THE INVENTION

It is therefore an object of the present invention to provide a method for fabricating an image display device comprising an active matrix substrate having a high-performance thin-film transistor circuit operating with a high mobility and the like as drive elements for driving pixel portions arranged as a matrix. The application of the present invention is not limited to the reformation of a polysilicon semiconductor film formed on an insulating substrate for the image display device. The present invention is also applicable to the reformation of a similar semiconductor film formed on another substrate, such as a silicon wafer, and the like.

Thus, the present invention adopts a novel method which forms discrete reformed regions each composed of a quasi-strip-like-crystal silicon film by selectively reforming a silicon film composing a circuit in a drive circuit region disposed on the periphery of the pixel region of an active matrix substrate through irradiation with a pulse modulated laser beam or a pseudo CW laser beam and forms drive circuits composed of active elements such as thin-film transistors or the like in the discrete reformed regions, thereby providing a high-performance image display device operating with high mobility As means for satisfying the foregoing requirement, the present invention irradiates an entire surface of an amorphous silicon film formed over the entire region of an insulating substrate to reform the amorphous silicon film into a polysilicon film, for example by excimer laser beam annealing or solid-state laser annealing or produces an insulating substrate formed with a polysilicon film, selectively irradiates the portion of the polysilicon film located in a drive circuit region placed on the periphery of the pixel region of the of the insulating substrate with a pulse modulated laser beam or a pseudo CW laser beam using a solid-state laser such that scanning in a specified direction is performed, and thereby forms discrete reformed regions each composed of a quasi-strip-like-crystal silicon film with a large-sized crystal resulting from the reformation such that crystals grown in the scanning direction have an continuous crystal boundary.

Each of the discrete reformed regions has a generally rectangular configuration. When a required circuit, such as a drive circuit, is formed in the rectangular discrete reformed region, the direction of the channel of an active element, such as a thin-film transistor, composing the circuit is controlled to be generally parallel with the direction of a crystal boundary in the quasi-strip-like-crystal silicon film. In accordance with the present invention, the aforementioned technology for forming the discrete reformed regions composed of the quasi-strip-like-crystal silicon films by irradiation with the pulse modulated laser beam will be termed SELAX (Selectively Enlarging Laser Crystallization).

In the fabrication of the image display device according to the present invention, the discrete reformed regions composed of the quasi-strip-like-crystal silicon films are formed preferably by the foregoing SELAX process which selectively irradiates the polysilicon film on the drive circuit portion with a laser beam (hereinafter also referred to simply as a laser) by using a reciprocal operation. Although the discrete reformed regions may also be formed entirely over the drive circuit region, it is recommended that the discrete reformed regions are formed to have generally rectangular configurations in a region of the drive circuit region which requires the formation of the discrete reformed regions as a result of considering the density of the drive circuit and the like. By arranging the generally rectangular discrete modified regions primarily in the requiring region of the drive circuit region, in particular, it becomes possible to perform the laser beam irradiation process with uniform efficiency and form the quasi-strip-like-crystal silicon film with uniform quality in each of the discrete reformed regions.

The quasi-strip-like-crystal silicon film according to the present invention is an aggregate of single crystals having a width of, e.g., 0.1 µm to 10 µm and a length of about 1 µm to 100 µm if the width is assumed to extend in a direction orthogonal to the direction of scanning with the laser beam and the length is assumed to extend in the scanning direction. By using such a quasi-strip-like-crystal silicon film, an excellent carrier mobility is achievable. The value of the excellent carrier mobility is about 300 $cm^2/Vs$ or more, preferably 500 $cm^2/Vs$ or more as electron mobility.

In the conventional reformation of a silicon film performed by using an excimer laser, numerous crystallized silicon grains ranging in size from about 0.05 µm to 0.5 µm (polysilicon) grow randomly in the portion irradiated with the laser beam. The electron mobility of such a polysilicon film is about 200 $cm^2/Vs$ or less and about 120 $cm^2/Vs$ on the average. Although this indicates improved performance compared with the electron mobility of an amorphous silicon film which is 1 $cm^2/Vs$ or less, the discrete reformed regions composed of the quasi-strip-like-crystal silicon films according to the present invention have electron mobility higher than the foregoing electron mobility.

A silicon film provided on the pixel regions of the insulating substrate composing the image display device according to the present invention is a polysilicon film obtained by reforming an amorphous silicon film formed by CVD or sputtering through irradiation with an excimer laser beam and a silicon film provided on the drive circuit region is a quasi-strip-like-crystal silicon film obtained by further reforming the crystal structure of the polysilicon film through irradiation with a pulse modulated laser beam or a pseudo CW laser beam each using a solid-state laser. The pulse modulation is defined herein as a modulation method which changes the width of a pulse, an interval between pulses, or both of them. Specifically, such a modulated pulse can be obtained by performing EO (Electro-Optic) modulation with respect to a CW (Continuous-Wave) laser.

In accordance with the present invention, the polysilicon film on the drive circuit region of the insulating substrate is selectively irradiated and scanned with the pulse modulated laser beam such that the selectively irradiated regions, i.e., the regions reformed into the quasi-strip-like-crystal silicon film are formed to have generally rectangular configurations which are arranged along the surface of the insulating substrate. Hereinafter, the generally rectangular regions will be referred to also as virtual tiles. The virtual tiles and the individual reformed regions composing the virtual tiles are arranged in divided relation to form blocks each composed of a plurality of tiles or regions in correspondence with the circuit portions to be formed thereafter. The use of such virtual tiles not only achieves the foregoing effect but also obviates the necessity to irradiate, with the laser beam, the region of a semiconductor film to be etched away in the process of forming a thin-film transistor and the like, thereby significantly reducing an unneeded operation.

In accordance with the present invention, an excimer laser, a continuous-wave solid-state laser oscillating at a wavelength of 200 nm to 1200 nm, or a solid-state pulse laser in the same wavelength range is used preferably to reform the amorphous silicon film into the polysilicon film. The laser beam preferably has a wavelength absorbed by amorphous silicon to be annealed, i.e., a UV wavelength or a visible wavelength. More specifically, the second and third harmonics or fourth harmonic of an Ar laser, an Nd:YAG laser, an Nd:YVO$_4$ laser, or an Nd:YLF laser can be used. If consideration is given to the magnitude of an output and stability, the second harmonic (with a wavelength of 532 nm) of an LD (Laser Diode) excited Nd:YAG laser or the second harmonic (with a wavelength of 532 nm) of the Nd:YVO$_4$ laser is most preferred. The upper and lower limits of such a wavelength are determined by a trade-off between the range in which the absorption of the beam in the silicon film occurs efficiently and a stable laser beam source which is economically available. The polysilicon film may also be formed in the stage of film deposition. For example, it can be formed directly on a substrate or on an underlie by cat-CVD (catalytic vapor deposition).

The solid-state laser according to the present invention features stable supply of a laser beam to be absorbed by the silicon film and a reduced economical load including a gas exchange operation peculiar to gas laser and the degradation of an emitter portion, so that it is preferred as means for economically reforming the silicon film. However, the present invention does not positively exclude an excimer laser having a wavelength of 150 nm to 400 nm as the laser.

The laser used to reform the polysilicon film into the quasi-strip-like-crystal silicon film in accordance with the present invention is preferably a continuous-wave solid-state laser, a pulse modulated solid-state laser, each oscillating at a wavelength of 200 nm to 1200 nm, or a pseudo CW solid-state laser (pseudo continuous-wave solid-state laser). The pseudo CW solid-state laser regards a pulse laser with a high frequency as a pseudo continuous-wave laser. By using a so-called mode locking technique, a pulse laser with a wavelength of 100 MHz or more is obtainable even if the wavelength is in a UV region. Even when the irradiation laser is a short pulse, if a next pulse is emitted within the solidification time (<100 ns.) of silicon, a melting time can be extended without involving the solidification of the silicon film so that the laser can be regarded as pseudo CW. In combination with the EO (Electro-Optic) modulation, it is possible to cause high-efficiency absorption of laser energy and provide a polycrystalline silicon film (quasi-strip-like-crystal silicon film) having a length controlled in the direction of scanning with the laser beam.

In the present invention, it is preferable to optically adjust the laser beam, equalize an intense spatial distribution, and perform irradiation by focusing the laser beam by using a lens system. In the present invention, the irradiation width when irradiation is performed by intermittent scanning with the laser beam is determined by considering an economical trade-off between the width of a region required for the drive circuit region and the rate of the width to the pitch. The width and length of the irradiated portion forming the foregoing virtual tile configuration are determined by considering the size, degree of integration, and the like of the circuit in use. The present invention is not limited to scanning over the insulating substrate performed by moving the laser beam. It is also possible to place the insulating substrate on an X-Y stage and intermittently perform the laser beam irradiation in synchronization with the movement of the X-Y stage.

In the present invention, irradiation with a continuous-wave, pulse laser beam is preferably performed by scanning at a speed of 50 mm/s to 3000 mm/s. The lower limit of the scanning speed is determined by a trade-off between the time required to scan the drive circuit region in the insulating substrate and an economical load. The upper limit of the irradiation speed is limited by the ability of mechanical equipment used for scanning.

The present invention performs scanning by using, for the laser irradiation, a beam obtained by converging a laser beam by means of an optical system. At this time, it is also possible to use an optical system which converges a single laser beam onto a single beam. If a large-sized substrate is to be processed in a short period of time, however, it is preferable to perform simultaneous scanning for the irradiation of pixel portions in a plurality of rows with a plurality of beams into which a single laser beam has been divided. This significantly improves the efficiency of laser beam irradiation. In the present invention, it is also possible to operate a plurality of laser oscillators in parallel for the laser irradiation. The use of the method is also particularly preferred if a large-sized substrate is to be processed in a short period of time.

In the present embodiment, an active element circuit formed from a silicon film reformed into a quasi-strip-like crystal is not limited to a typical top-gate thin-film transistor circuit. It is also possible to use a bottom-gate thin-film transistor circuit instead. In the case where a single-channel circuit of only an N-channel MIS or a P-channel MIS is required, a bottom-gate type may be rather preferred in terms of reducing the number of fabrication process steps. In this case, the silicon film formed on gate wiring with an insulating film interposed therebetween is reformed into a quasi-strip-like-crystal silicon film by laser irradiation so that the use of a refractory metal for a gate wiring material is preferred and the use of a gate wiring material containing tungsten (W) or molybdenum (Mo) as a main component is preferred.

By using, as an active matrix substrate, the insulating substrate having a semiconductor structure such as a thin-film transistor for the drive circuit according to the present invention, a liquid crystal display device with excellent image quality can be provided at low cost. By using the active matrix substrate according to the present invention, an organic EL display device with excellent image quality can also be provided at low cost. The present invention is not only applicable to the liquid crystal display device and the organic EL display device but also applicable to an active-matrix image display device in another system having a similar semiconductor structure in the drive circuit thereof and to various semiconductor devices formed on a semiconductor wafer.

BRIEF DESCRIPTION OF THE DRAWINGS

FIGS. 10A to 10C are views illustrating the process of a method for fabricating an image display device according to an embodiment of the present invention;

FIGS. 12G to 12I are views illustrating the process of the method for fabricating an image display device according to the embodiment, which is subsequent to FIG. 11F;

FIGS. 13J and 13K are views illustrating the process of the method for fabricating an image display device according to the embodiment, which is subsequent to FIG. 12I;

FIGS. 14L and 14M are views illustrating the process of the method for fabricating an image display device according to the embodiment, which is subsequent to FIG. 13K;

FIGS. 27P-1 to 27P-3 are views illustrating a first example of the formation of a positioning mark on an active matrix substrate SUB1 and a process of continuous pulse laser irradiation targeted at the mark;

FIGS. 28P-1 to 28P-3 are views illustrating a second example of the formation of the positioning mark on an active matrix substrate SUB1 and the process of continuous pulse laser irradiation targeted at the mark;

FIGS. 29P-1 to 29P-3 are views illustrating a third example of the formation of the positioning mark on an active matrix substrate SUB1 and the process of continuous pulse laser irradiation targeted at the mark;

DETAILED DESCRIPTION OF THE PREFERRED EMBODIMENTS

Figure 1:
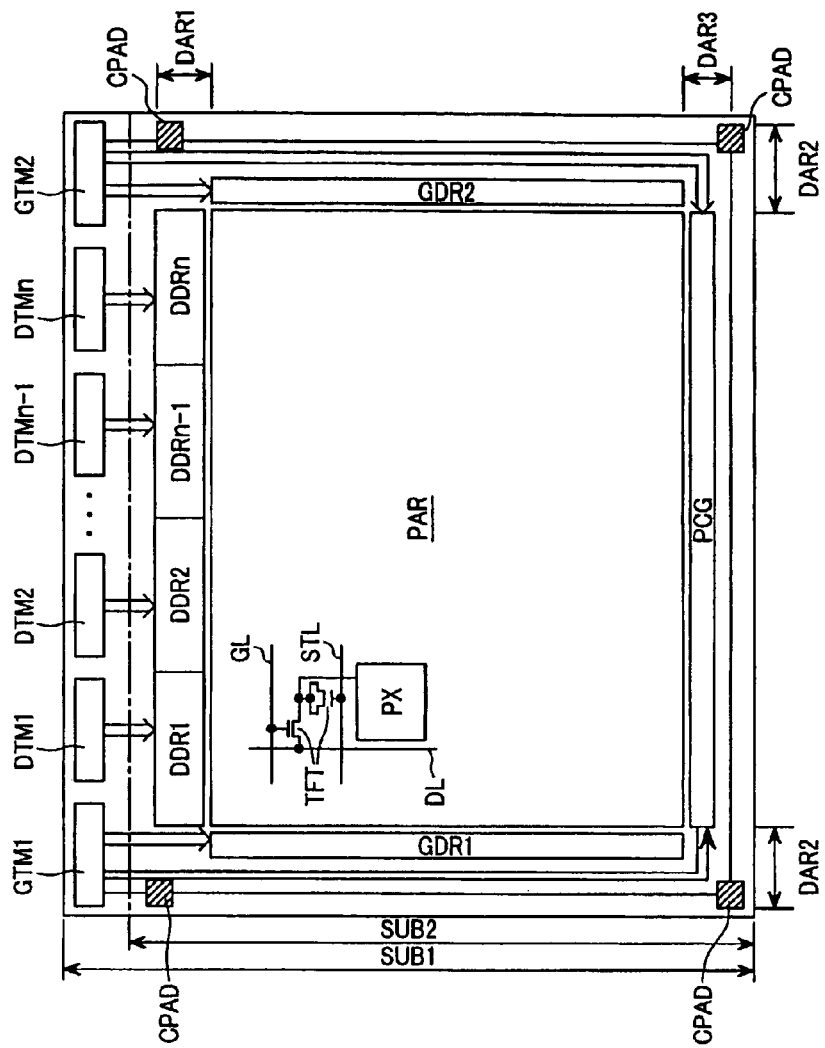
FIG. 1 is a plan view for schematically illustrating a liquid crystal display device as an example of an image display device fabricated by using a fabrication method according to the present invention.

Referring to the drawings, the embodiments of the present invention will be described herein below in detail.

FIG. 1 is a plan view for schematically illustrating a liquid crystal display device as an example of an image display device fabricated by using a fabrication method according to the present invention. In FIG. 1, a reference numeral SUB1 denotes an active matrix substrate and a reference numeral SUB2 denotes a color filter substrate bonded to the active material substrate SUB1. The end portion of each of the active matrix substrate SUB1 and the color filter substrate SUB2 bonded to each other with a liquid crystal layer interposed therebetween is indicated by a virtual line. Although the color filter substrate SUB2 has an inner surface formed with a color filter or a common electrode, it is not depicted in FIG. 1. Although the following description will be given by using a liquid crystal display device using a color filter substrate as mentioned above, the present invention is also applicable to a liquid crystal display device in a configuration in which a color filter is formed on an active matrix substrate.

The active matrix substrate SUB1 has a pixel region PAR occupying the majority of the center portion thereof and drive circuit regions DAR1, DAR2, and DAR3 which are located externally of the pixel region PAR and formed with circuits for supplying drive signals to a large number of pixels formed in the pixel region PAR. In the present embodiment, the drive circuit region DAR1 formed with data drive circuits DDR1, DDR2, . . . DDRn−1, and DDRn for supplying display data to the pixels is disposed along one of the long sides (the upper side in FIG. 1) of the active matrix substrate SUB1. The drive circuit region DAR2 having scan circuits GDR1 and GDR2 is disposed along each of the both sides (the left-hand and right-hand sides in FIG. 1) adjacent to the drive circuit region DAR1. The drive circuit region DAR3 having a so-called precharge circuit is disposed along the other long side (the lower side in FIG. 1) of the active matrix substrate SUB1.

At the four corners where the active matrix substrate SUB1 and the color filter substrate SUB2 are in superimposed relation, pads CPAD for supplying a common electrode potential from the active matrix substrate SUB1 to the common electrode of the color filter substrate SUB2 are provided. The pads CPAD need not necessarily be provided at the four corners. It is also possible to provide the pad CPAD at any one of the corners or the pads CPAD at any two or three of the corners.

Along the one long side of the active matrix substrate SUB1 which is not in superimposed relation with the color filter substrate SUB2, the input terminals DTM (DTM1, DTM2, ... DTMn-2, and DTMn) of the data drive circuits DDR (DDR1, DDR2, ... DDRn-1, and DDRn) and the input terminals GTM (GTM1 and GTM2) of the scan circuits GDR (GDR1 and GDR2) are formed on the edge of the active matrix substrate SUB1. The pixels arranged as a matrix in the pixel region PAR are provided at intersections of data lines DL extending from the data drive circuits DDR and gate lines GL extending from the scan circuits GDR. Each of the pixels is composed of a thin-film transistor TFT and a pixel electrode PX.

In such a structure, the thin-film transistors TFT connected to the gate line GL selected by the scan circuits GDR (GDR1 and GDR2) are turned ON, a display data voltage supplied via the data lines DL extending from the data drive circuits DDR (DDR1, DDR2, ... DDRn-1, and DDRn) is applied to the pixel electrode PX, and an electric field is generated between the pixel electrode PX and the common electrode provided on the color filter substrate SUB2. The electric field changes liquid crystal orientation in the liquid crystal layer of the pixel portion so that the pixel is displayed.

In the liquid crystal display device shown in FIG. 1, the scan circuit GDR is divided into the two systems GDR1 and GDR2 which are disposed on the left and right sides of the active matrix substrate SUB1, while the respective gate lines GL extending from the scan circuits GDR1 and GDR2 are alternately disposed in interdigitating relation. However, the present invention is not limited thereto. It is also possible to dispose only one scan circuit GDR on either of the left and right sides of the active matrix substrate SUB1. In the following description, the active matrix substrate SUB1 provided with only one scan circuit GDR as described above will be used as an example. Although the present invention is applicable to each of the drive circuit regions DAR1, DAR2, and DAR3, it is applied primarily to the drive circuit region DAR1 in a most precise circuit structure.

Figure 2:
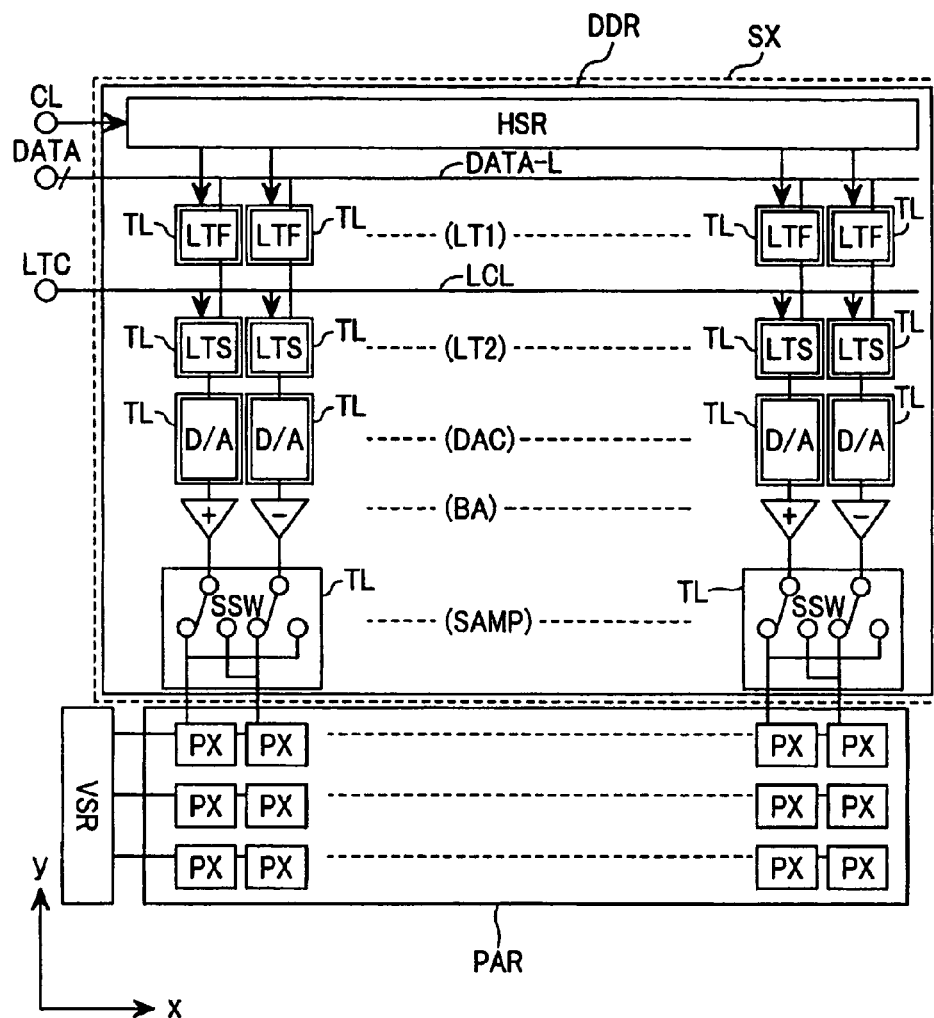
FIG. 2 is a block diagram illustrating an exemplary circuit structure of a data drive circuit portion in FIG. 1.

FIG. 2 is a block diagram illustrating an exemplary circuit structure of the data drive circuit portion in FIG. 1. In FIG. 2, a reference numeral PAR denotes the pixel region. In the pixel region, the pixels PX described above are arranged as a matrix in a horizontal (x) direction and a vertical (y) direction (the pixels are denoted by pixel electrodes PX). A reference numeral DDR denotes a data drive circuit. The data drive circuit DDR is constituted by a horizontal shift register HSR, a first latch circuit LT1 composed of a latch circuit LTF, a second latch circuit LT2 composed of a latch circuit LTS, a digital-analog converter DAC composed of a digital-analog converting circuit D/A, a buffer circuit BA, a sampling circuit SAMP composed of a sampling switch SSW, and a vertical shift register VSR.

Various clock signals CL inputted from signal sources not shown via the input terminals DTM enter the horizontal shift register HSR and traverse the data drive circuits DDR (DDR1, DDR2, ... DDR1-n, and DDRn) to be transferred successively. The display data DATA on a data line DATA-L is latched therefrom by the first latch circuit LT1. The display data latched by the first latch circuit LT1 is latched by the second latch circuit LT2 in response to a latch control signal applied to a latch control line. The display data latched by the second latch circuit LT2 passes through the digital-analog converter DAC, the buffer circuit BA, and the sampling circuit SAMP to be supplied to the pixel PX in the pixel region PAR connected to the gate line selected by the vertical shift register VSR.

The present embodiment uses discrete reformed regions composed of a quasi-strip-like-crystal silicon film reformed to have a crystal boundary continuous in the scanning direction through selective irradiation performed by scanning the portion of the data drive circuit DDR with a pulse modulated laser beam. The range in which the discrete reformed regions are used is indicated by a reference numeral SX. Ideally, the discrete reformed regions are provided throughout the range SX. However, it is also possible to perform continuous reformation with respect to the circuit in one part of the range SX in consideration of productivity including throughput. The discrete modified region is designated by a reference numeral TL. A description will be given herein below by using, as an example, a case where the silicon film of the circuit portion composing the sampling switch SSW in the discrete reformed region SX is reformed into a rectangular configuration. For the sake of convenience, such a rectangular region resulting from continuous reformation will be referred to also as a virtual tile. The size of the virtual tile is set to correspond to the scale of the circuit to be formed or allow the formation of a plurality of circuits.

Figure 3:
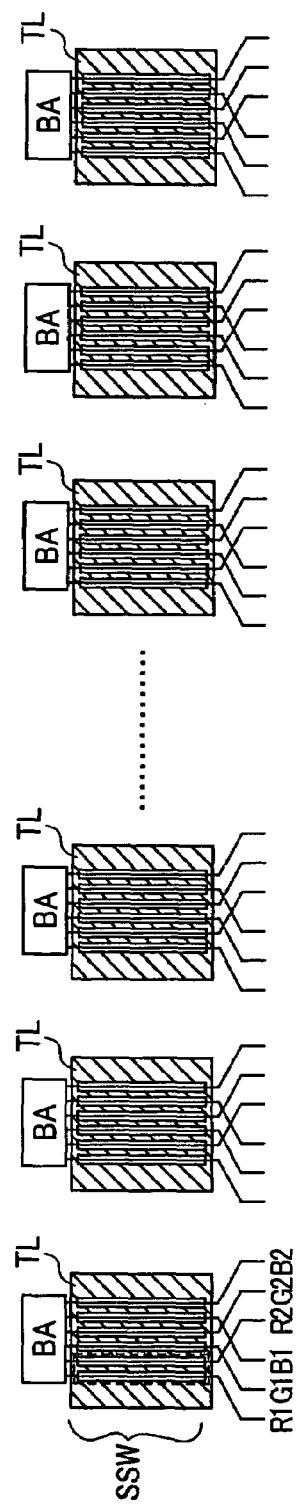
FIG. 3 is a structural view of each of sampling switch portions composing respective sampling circuits in FIG. 2.

FIG. 3 is a structural view of sampling switch portions composing the sampling circuits shown in FIG. 2. The sampling switches SSW are formed in the respective virtual tiles TL arranged in a row in the x direction. Each of the sampling switches SSW is composed of an analog switch and has a circuit structure more precise than that of the other components of the data drive circuits DDR so that they are densely arranged. Since the thin-film transistors composing the sampling switches SSW are formed in the discrete reformed regions with high electron mobility, they can be formed with higher precision than the other circuits. Since the signal lines R1, G1, B1, R2, G2, and B2 are arranged with a pixel pitch in the pixel region, the spacing between the output lines (signal lines) thereof is narrower on the output ends of the sampling switches SSW and wider on the pixel-region side in the resulting wiring pattern.

The buffer circuit BF outputs display data inputted from the horizontal shift register HSR and three signals obtained by inverting three signals indicative of the display data. Since the buffer circuit BF outputs signals for two pixels, the total of twelve signals are outputted from the buffer circuit BF. In the case shown herein, the horizontal shift register HSR in one stage processes two pixels at a time. In data (video signals) on each of colors for each of the pixels, the signals of opposite polarities form pairs. Each of the sampling switches SSW determines which one of the signals of the opposite polarities should be transmitted for each of the pixels. As shown in FIG. 2, the polarities of the adjacent ones of the pixels are constantly opposite to each other due to the structure of the sampling switch SSW. In FIG. 3, R1 represents a signal line for a pixel 1 (red), G1 represents a signal line for the pixel 1 (green), B1 represents a signal line for the pixel 1 (blue), R2 represents a signal line for a pixel 2 (red), G2 represents a signal line for the pixel (2), and B2 represents a signal line for the pixel 2 (blue).

Figure 4:
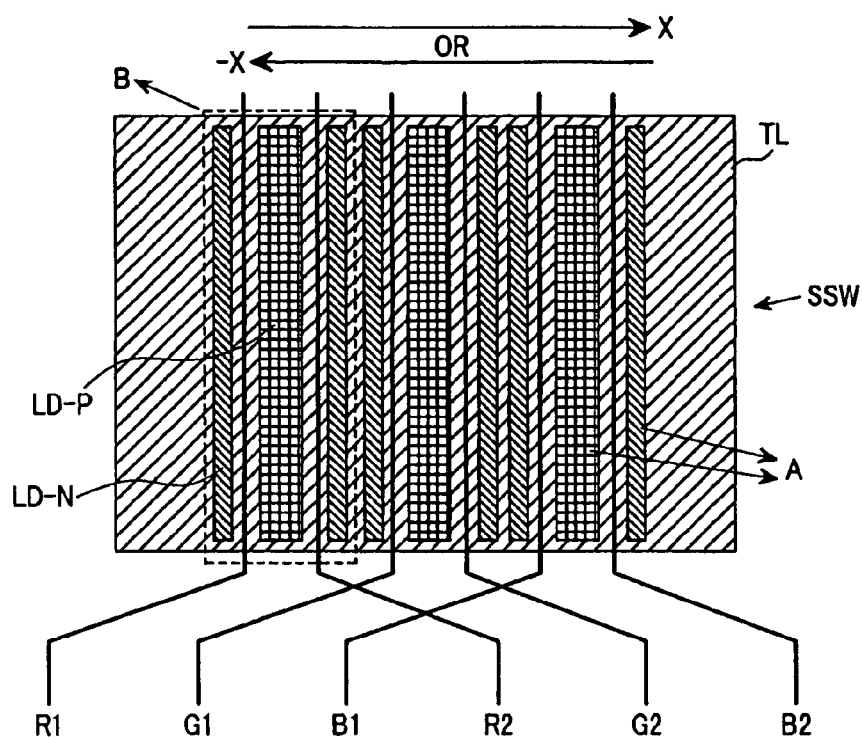
FIG. 4 is an enlarged plan view illustrating a structure of each of the sampling switch circuits formed in respective virtual tiles shown in FIG. 3.
Figure 5:
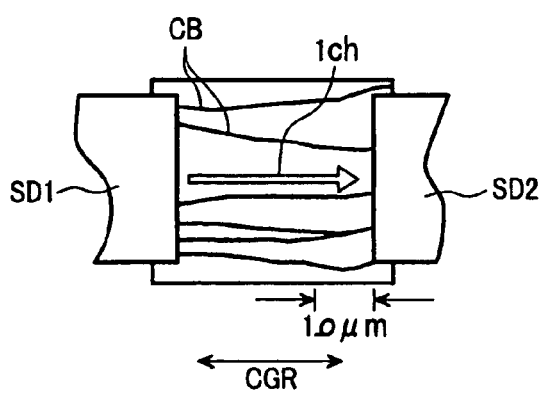
FIG. 5 is a schematic diagram of the channel portion of a thin-film transistor (TFT), which shows crystal orientation in a quasi-strip-like-crystal silicon film by further enlarging the principal portion of FIG. 4.

FIG. 4 is an enlarged plan view illustrating a structure of each of the sampling switch circuits formed in the respective virtual tiles shown in FIG. 3. FIG. 5 is a schematic diagram of the channel portion of the thin-film transistor (TFT), which shows crystal orientation in a quasi-strip-like-crystal silicon film by further enlarging the principal portion of FIG. 4. The virtual tile TL has been reformed by scanning with the pulse modulated laser beam in the scanning direction x (or −x). The portion of the virtual tile TL designated by the reference numeral LD-P is a silicon island to be formed with a P-type TFT and the portion thereof indicated by the reference numeral LD-N is a silicon island to be formed with an N-type TFT.

As shown in FIG. 5, a crystal boundary CB existing between the single crystals in the quasi-strip-like-crystal silicon film of the silicon islands LD-P and LD-N is substantially unidirectional in the crystal orientation CGR. The source and drain electrodes SD1 and SD2 are formed at opposing positions in the crystal orientation CGR so that the direction of a current (channel current) 1ch flowing between the source and drain electrodes SD1 and SD2 is generally parallel with the crystal orientation CGR. By thus controlling the current 1ch such that it flows in the same direction as the crystal orientation CGR, the electron mobility in the channel is increased.

Figure 6:
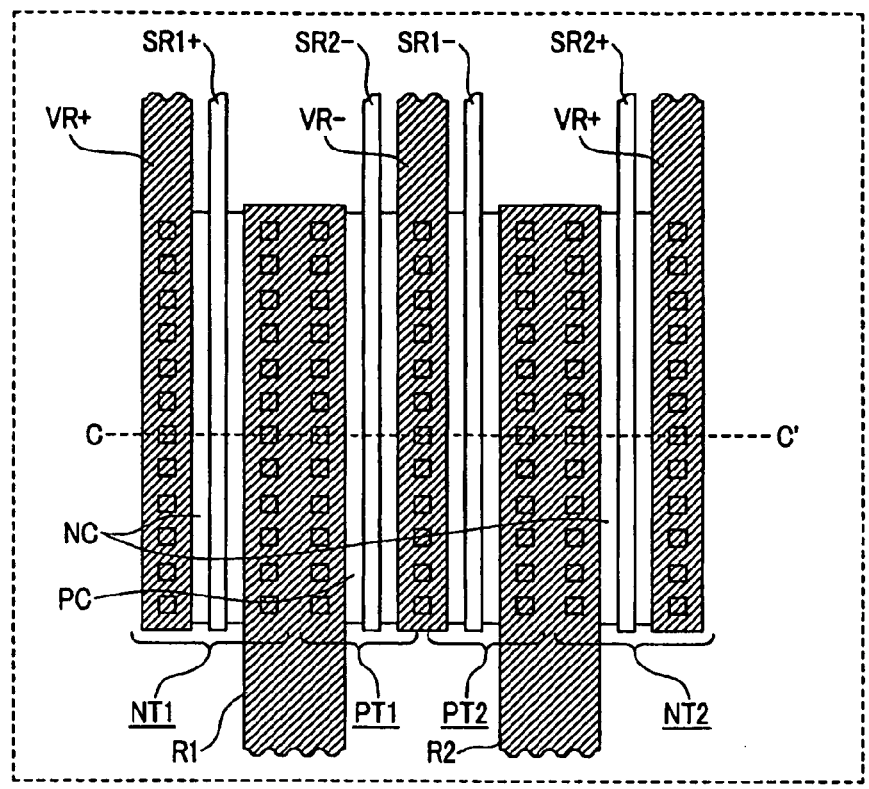
FIG. 6 is an enlarged plan view of the portion B in the virtual tile shown in FIG. 4.
Figure 7:
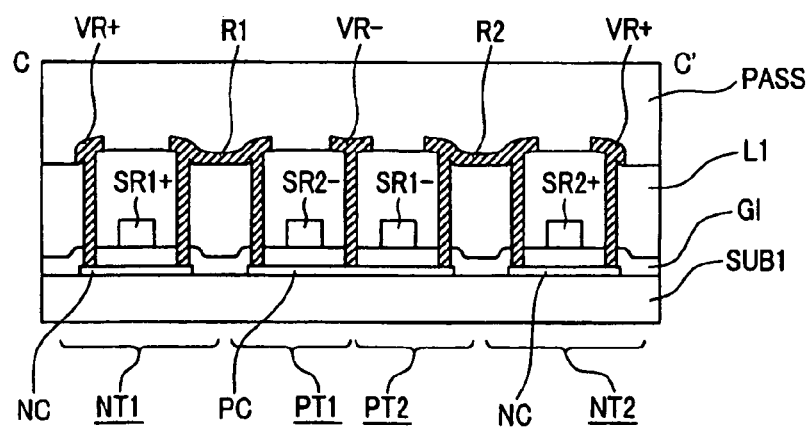
FIG. 7 is a cross-sectional view taken along the line C–C' of FIG. 6.
Figure 8:
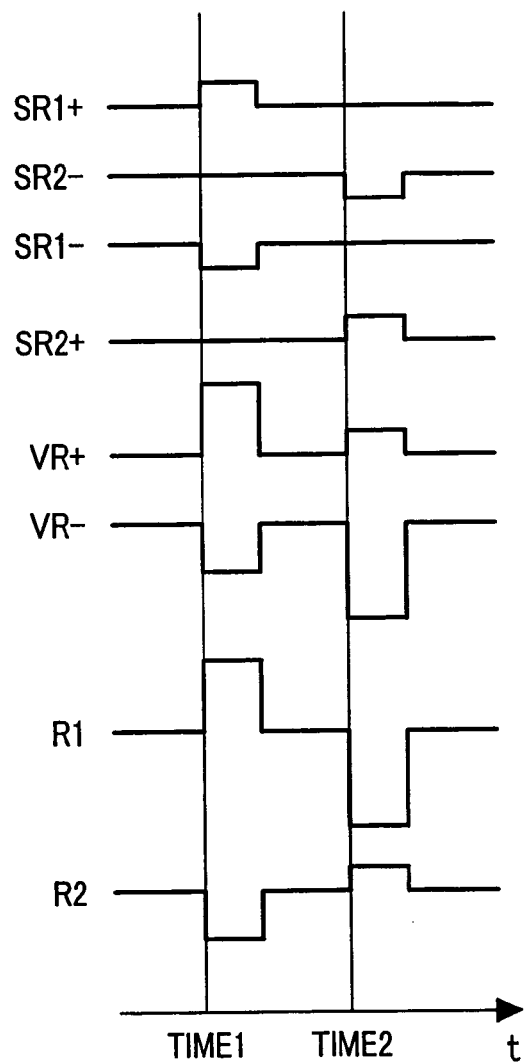
FIG. 8 is a timing chart illustrating operation shown in FIG. 6.

FIG. 6 is an enlarged plan view of the portion B in the virtual tile shown in FIG. 4. FIG. 7 is a cross-sectional view taken along the line C–C' of FIG. 6. FIG. 8 is a timing chart illustrating operation shown in FIG. 6. The structures and operations shown in FIGS. 6 and 7 will be described with reference to FIGS. 7 and 2. In FIG. 6, the reference numerals NT1 and NT2 denote N-type thin-film transistors, PT1 and PT2 denote P-type thin-film transistors, SR1$^+$, SR1$^-$, SR2$^+$, and SR2$^-$ denote lines for signals transmitted from the horizontal shift register HSR via the buffer BA, and VR$^+$ and VR$^-$ denote a red data signal (a red video signal). In FIG. 7, the reference numeral SUB1 denotes the active matrix substrate, NC denotes an N-type channel, PC denotes a P-type channel, GI denotes a gate insulating film, L1 denotes an interlayer insulating film, and PASS denotes an insulation protection film.

In FIG. 8, "1" is outputted to the signal line SR1$^+$ and "−1" is outputted to the signal line SR1$^-$ at the time 1, while "−1" is outputted to the signal line SR2$^-$ and "1" is outputted to the signal line SR2$^+$ at the time 2. The red data signal VR$^+$ outputs a signal (of the polarity +) for the pixel 1 at the time 1 and a signal (of the polarity +) for the pixel 2 at the time 2. Likewise, the red data signal VR$^-$ outputs a signal (of the polarity −) for the pixel 2 at the time 1 and a signal (of the polarity −) for the pixel 1 at the time 2. The N-type thin-film transistor NT1 is turned ON at the time 1 to output the red data signal VR$^+$ to the signal line R1. The P-type thin-film transistor PT1 is turned ON at the time 2 to output the red data signal VR$^-$ to the signal line R1.

The N-type thin-film transistor NT2 is turned ON at the time 2 to output the red data signal VR$^+$ to the signal line R2 and the P-type thin-film transistor PT2 is turned ON at the time 1 to output the red data signal VR$^-$ to the signal line R2. Consequently, the signal line R1 outputs data (pixel signal) of the polarity + at the time 1 and data (pixel signal) of the polarity − at the time 2. On the other hand, the signal line R2 outputs data (pixel signal) of the polarity − at the time 1 and data (pixel signal) of the polarity + at the time 1.

In the embodiment described above, the virtual tile TL of the quasi-strip-like-crystal silicon film is provided for each of the circuit formation portions of the sampling switches SSW composing the sampling circuits SAMP. As stated previously, each of the sampling switches SSW is composed of an analog switch, which is a portion having a complicated circuit structure and required to have particularly high precision. The formation of the thin-film transistor by providing the quasi-strip-like-crystal silicon film shown by the virtual tile TL in the circuit portion allows a circuit with high electron mobility and with increased precision to be implemented. As a result, high-speed image display can be performed. The portions in which the virtual tiles are provided are not limited to the foregoing sampling circuits SAMP. The virtual tiles can also be used in proper circuit formation portions within the range SX shown in FIG. 2.

Figure 9:
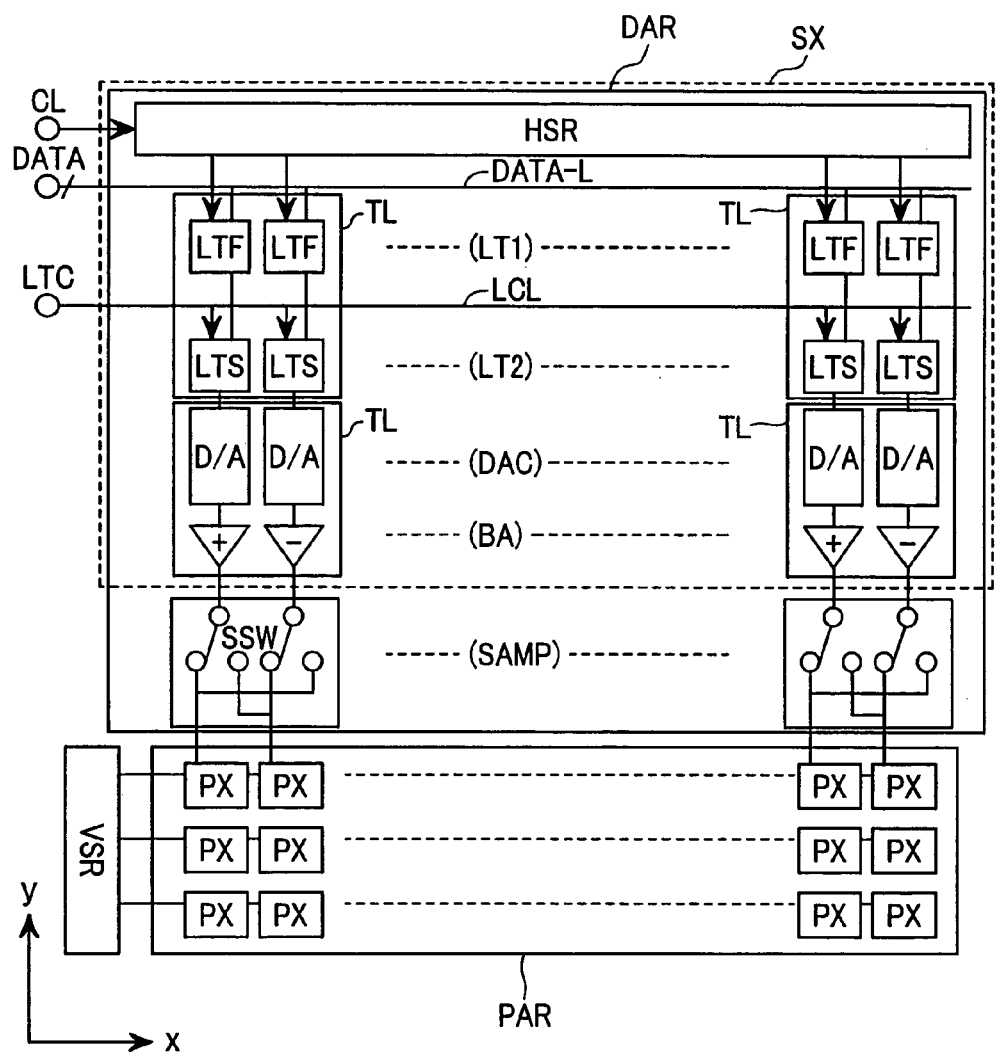
FIG. 9 is a block diagram for diagrammatically illustrating another embodiment obtained by applying the image display device according to the present invention to a liquid crystal display device, which is similar to FIG. 2.
Figure 11:
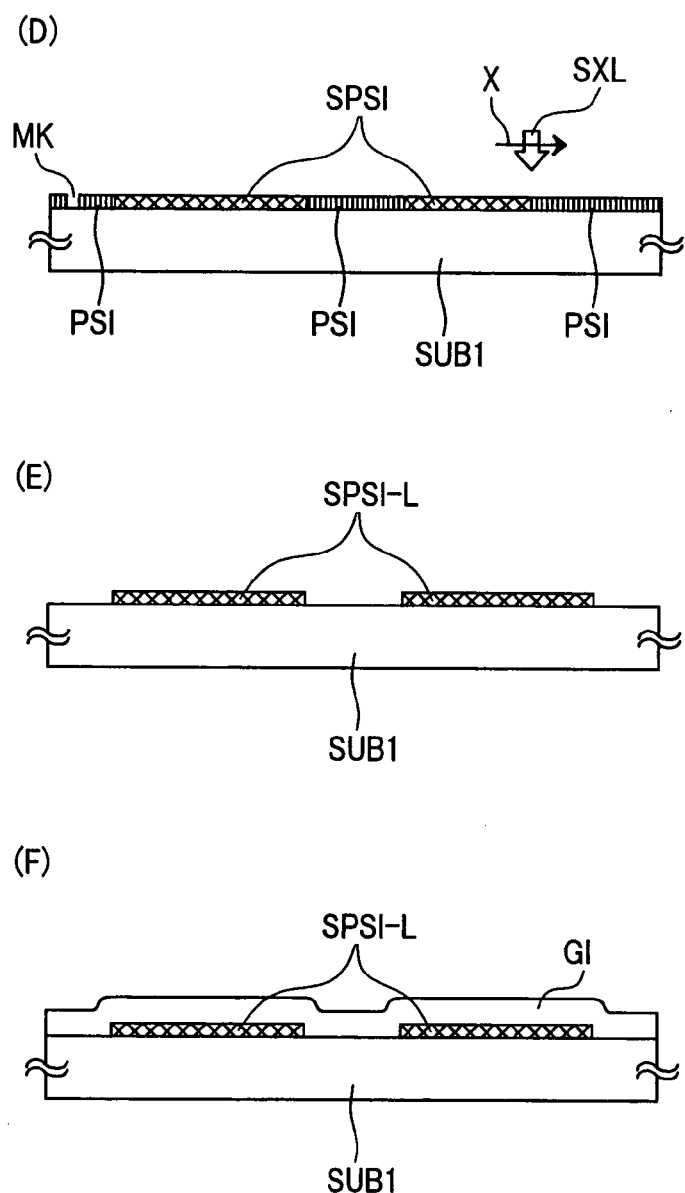
FIGS. 11D to 11F are views illustrating the process of the method for fabricating an image display device according to the embodiment, which is subsequent to FIG. 10C.
Figure 15:
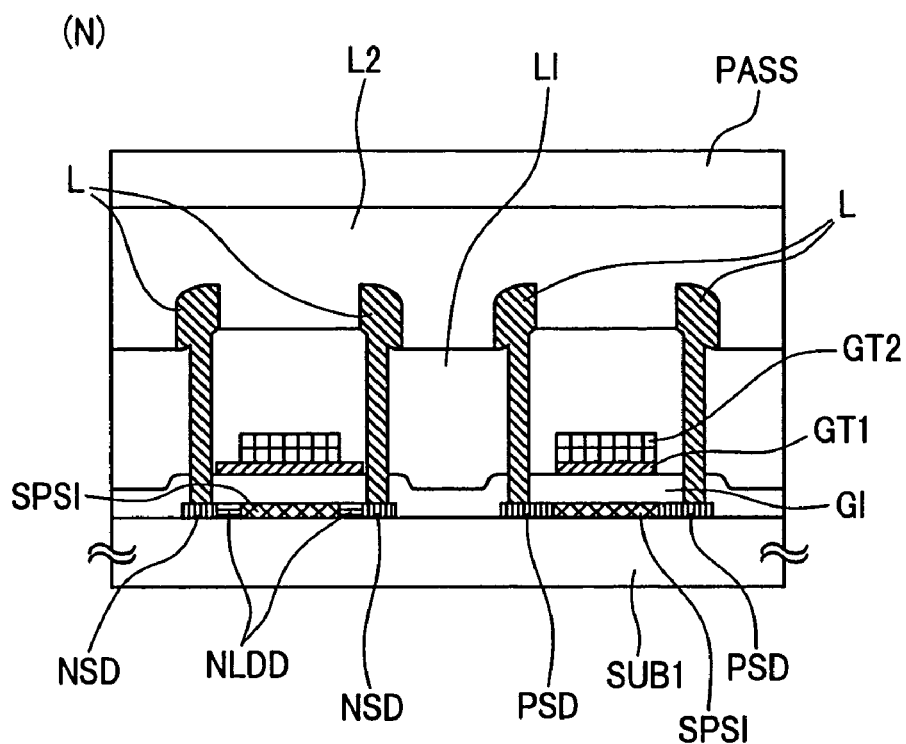
FIG. 15N is a view illustrating the process of the method for fabricating an image display device according to the embodiment, which is subsequent to FIG. 14M.

FIG. 9 is a block diagram similar to FIG. 2 for schematically illustrating another embodiment in which the image display device according to the present invention is applied to a liquid crystal display device. The present embodiment has formed the virtual tiles TL in the respective portions of the first and second latch circuits LT1 and LT2, the digital-analog converter DAC, and the buffer circuit BA. Thus, the present embodiment has formed the virtual tiles TL in two or more rows parallel with each other in the x direction. As for the other structure, it is the same as shown in FIG. 2 so that overlapping description thereof will be omitted. Although each of the virtual tiles TL is shown in an outlined range for the sake of simplicity, there are also cases where each of the virtual tiles TL form an aggregate composed of blocks each consisting of a plurality of virtual tiles each having an appropriate size in accordance with the circuit size used.

By providing the quasi-strip-like-crystal silicon films shown by the virtual tiles TL in these circuit portions, it becomes possible to enhance electron mobility and definition. As a result, high-speed and high-definition image display can be performed. The portions in which the virtual tiles are provided are not limited to the foregoing ones. They may also include the sampling circuits SAMP, in the same manner as in FIG. 2. The virtual tiles TL may also be formed in various sizes to be provided in the first and second latch circuits LT1 and LT2, the digital-analog converter DAC, the buffer circuit BA, and a circuit obtained by properly combining the foregoing.

The sizes and arrangement of the virtual tiles and those of the individual reformed regions described in each of the foregoing embodiments may be determined appropriately by considering a pattern in which the thin-film transistors of a circuit in use are formed. For example, a staggered arrangement or the like is also possible. A regular arrangement need not necessarily be performed.

Although each of the foregoing embodiments has applied the discrete reformed regions (virtual tiles) composed of the quasi-strip-like-crystal silicon films to the drive circuit region DAR1 forming a data-side drive circuit, the present invention is not limited thereto. The discrete reformed regions (virtual tiles) composed of the quasi-strip-like-crystal silicon films are also applicable to the scan drive circuit region DAR2 or to the drive circuit region DAR3 having a precharge circuit.

Thus, the structure of each of the foregoing embodiments allows the fabrication of an image display device comprising an active matrix substrate having high-performance thin-film transistor circuits which operate with high mobility as drive circuits for driving pixel portions arranged as a matrix and provides a high-quality image display device.

A description will be given next to the embodiments of the method for fabricating an image display device according to the present invention with reference to FIGS. 10A to 15N. The fabrication method which will be described herein below uses the fabrication of a CMOS thin-film transistor as an example. An N-type thin-film transistor is formed to have a self-aligned GOLDD (Gate Overlapped Light Doped Drain). A P-type thin-film transistor is formed by counter doping.

FIGS. 10A to 15N show a sequence of fabrication processes. The sequence of fabrication processes will be described with reference to FIG. 10A to FIG. 15N. First, a heat resistant glass substrate SUB1 with a thickness of about 0.3 mm to 1.0 mm which undergoes only reduced deformation and shrinkage in a heat treatment preferably at 400° C. to 600° C. is prepared as an insulating substrate serving as an active matrix substrate. Preferably, a SiN film with a thickness of about 50 nm which functions as a thermal and chemical barrier film and a SiO film with a thickness of about 100 nm are deposited continuously and uniformly by CVD on the glass substrate SUB1. An amorphous silicon film ASI is formed by means of CVD or the like on the glass substrate SUB1 (FIG. 10A).

Next, scanning with an excimer laser beam ELA is performed in the x direction to melt and crystallize the amorphous silicon film ASI, thereby reforming the entire amorphous silicon film ASI on the glass substrate SUB1 into a polycrystalline silicon film, i.e., a polysilicon film PSI (FIG. 10B).

Instead of the method using the excimer laser beam ELA, another method using, e.g., solid pulse laser annealing may also be adopted to cause crystallization. In forming a silicon film, it is also possible to use a Cat-CVD film which is to form a polysilicon film.

A positioning mark MK serving as a target in determining a position to be irradiated with a laser beam SXL such as a pulse modulated laser (the use of a pulse-width modulated laser is assumed here), which will be described later, is formed by photolithography or dry etching (FIG. 10C).

With reference to the mark MK, scanning with the pulse modulated laser beam SXL is performed in the x direction to selectively and discretely irradiate a specified region. By the selective irradiation, the polysilicon film PSI is reformed and the discrete reformed regions composed of the quasi-strip-like-crystal silicon films having a crystal boundary continuous in the scanning direction (the silicon film of each of the virtual tiles) SPSI are formed. At this time, the virtual tiles can also be formed simultaneously in the drive circuit regions DAR3 located along the sides adjacent to the drive circuit regions DAR1 and DAR2 by extensively applying the laser beam scanning the drive circuit regions DAR1 and/or DAR2 in FIG. 1 such that the drive circuit region DAR is covered therewith (FIG. 11D).

The discrete reformed regions composed of the quasi-strip-like-crystal silicon films (the silicon film of each of the virtual tiles) SPSI are processed by photolithography so that islands SPSI-L in which the thin-film transistors are to be formed are formed (FIG. 11E).

A gate insulating film GI is formed to cover the islands SPSI-L of the discrete reformed regions (the silicon film of each of the virtual tiles) SPSI (FIG. 11F).

Implantation NE for threshold control is performed with respect to the region to be formed with the N-type thin-film transistor. During the implantation, the region to be formed with the P-type thin-film transistor is covered with a photoresist RNE (FIG. 12G).

Next, implantation PE for threshold control is performed with respect to the region to be formed with the P-type thin-film transistor. During the implantation, the region to be formed with the N-type thin-film transistor is covered with a photoresist RPE (FIG. 12H).

Then, metal gate films GT1 and GT2 serving as the gate electrodes of the thin-film transistors are formed in two layers thereon by sputtering or CVD (FIG. 12I).

The regions formed with the metal gate films GT1 and GT2 are covered with the photoresist RN and the metal gate films GT1 and GT2 are patterned by photolithography. To form LDD regions, a required amount of side etching is performed with respect to the upper-layer metal gate film GT2 to retract the metal gate film GT2 from the lower-layer metal gate film GT1. In this state, an N-type impurity N is implanted by using the photoresist RN as a mask so that the source/drain regions NSD of the N-type thin-film transistor are formed (FIG. 13J).

The photoresist RN is removed and implantation LDD is performed by using the metal gate film GT2 as a mask, thereby forming the LDD regions LDD of the N-type thin-film transistor (FIG. 13K).

The region to be formed with the N-type thin-film transistor is covered with a photoresist RP and a P-type impurity P is implanted into the source/drain formation regions of the P-type thin-film transistor so that the source/drain regions PSD of the P-type thin-film transistor are formed (FIG. 14L).

The photoresist RP is removed. After the implanted impurities are activated, an interlayer insulating film L1 is formed by CVD or the like (FIG. 14M).

A contact hole is formed by photolithography in the interlayer insulating film L1 and in the gate insulating film GI. A metal layer for line is connected to each of the respective sources and drains NSD and PSD of the N-type and P-type thin-film transistors via the contact hole, whereby a line is formed. An interlayer insulating film L2 is formed thereon and a protective insulating film PASS is further formed (FIG. 14N).

By the foregoing steps, a MOS thin-film transistor is formed in the discrete reformed regions composed of the quasi-strip-like-crystal silicon films (the silicon films of each of the virtual tiles). In general, the N-type thin-film transistor undergoes severe degradation. If light doped impurity regions LDD (Light Doped Drain Regions) are formed between the channel and the source/drain regions, the degradation is reduced. The gate overlapped light doped drain GOLDD has a structure in which the gate electrode covers the light doped impurity regions. In this case, a reduction in performance observed in the light doped drain LDD regions is reduced. In the P-type thin-film transistor, degradation is not so serious as in the N-type thin-film transistor so that the light doped impurity regions LDD and the gate overlapped light doped drain GOLDD are not normally used.

Figure 16A:
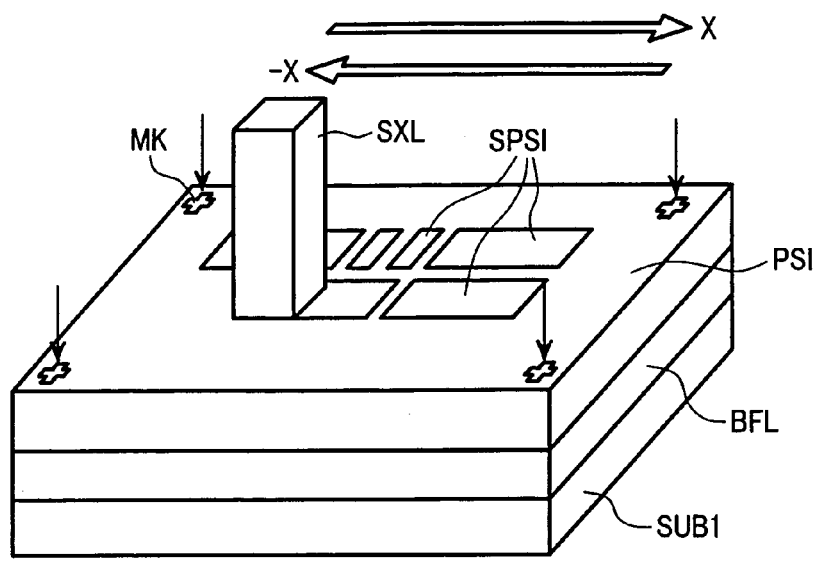
FIGS. 16A to 16C are views illustrating the process of forming discrete reformed regions (virtual tiles) composed of the quasi-strip-like-crystal silicon film.
Figure 16B:
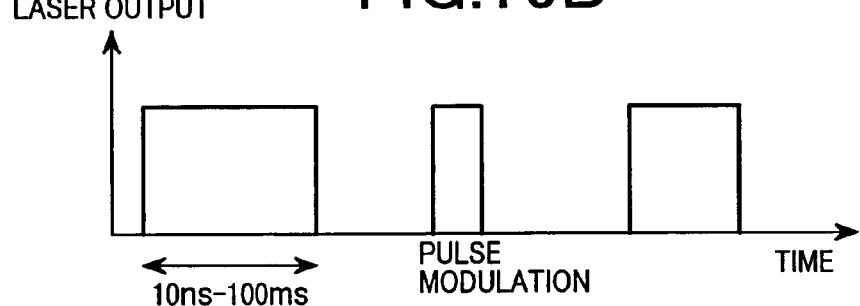
Figure 16C:
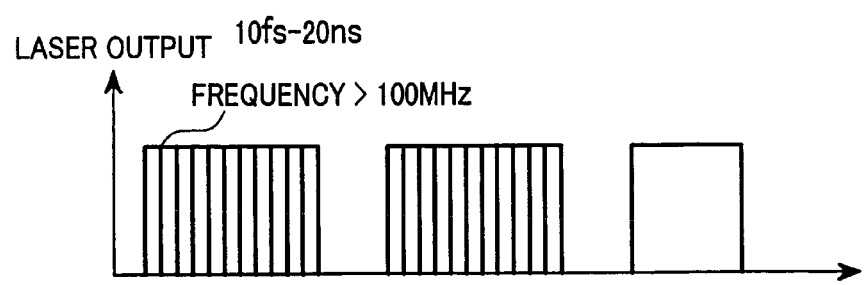

A description will be given next to the formation of the discrete reformed regions composed of the quasi-strip-like-crystal silicon films (the silicon films of the virtual tiles), which characterize the present invention, with reference to FIGS. 16A to 26. FIGS. 16A to 16C are views illustrating the process of forming the discrete reformed regions composed of the quasi-strip-like-crystal silicon films (the silicon films of the virtual tiles), of which FIG. 16A is a schematic diagram illustrating the process, FIG. 16B shows an example of the waveform of a pulse modulated laser, and FIG. 16C shows an example of the waveform of a pseudo CW laser.

The discrete reformed regions composed of the quasi-strip-like-crystal silicon films (the silicon films of the virtual tiles) are obtained by irradiating the polysilicon film PSI formed on the buffer layer BFL of the insulating substrate SUB1 with the laser beam SXL shown in FIG. 16B or 16C. As the laser beam SXL, the pulse modulated beam shown in FIG. 16B or the pseudo CW laser beam shown in FIG. 16C is applied in periods of 10 ns to 100 ms. By scanning the substrate SUB1 (in the x direction) with the laser beam XSL applied, shifted in the y direction, and then applied in the −x direction, the silicon film SPSI having quasi-strip-like crystals in the x and −x directions as the scanning directions are obtained, as shown in FIG. 16A. The insulating substrate SUNB1 has a positioning mark MK and the scanning with the laser beam XSL is performed by using the mark MK as the positioning target. Since the scanning of the substrate is thus performed by intermittent laser irradiation, the quasi-strip-like-crystal silicon films PSI can be arranged in the virtual tiles.

Figure 17A:
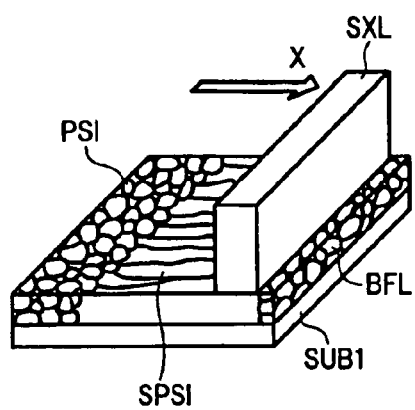
FIGS. 17A and 17B are views each illustrating a crystal structure of the quasi-strip-like-crystal silicon film.
Figure 17B:
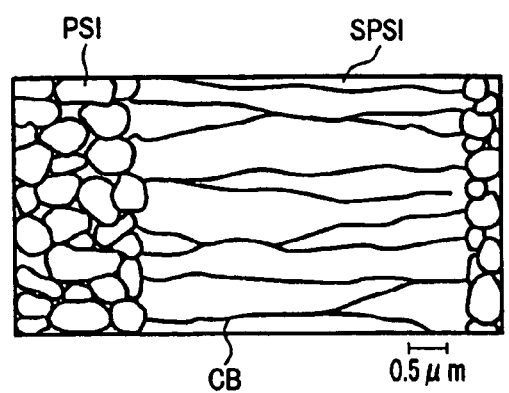

FIGS. 17A and 17B are views illustrating the crystal structure of each of the quasi-strip-like-crystal silicon films, of which FIG. 17A is a schematic diagram illustrating a form of scanning with the laser beam SXL and FIG. 17B is a schematic diagram showing, for comparison, the different crystal structures of the quasi-strip-like-crystal silicon film SPSI formed by scanning with the laser beam SXL and the polysilicon film PSI remaining in the unscanned portions. By reforming the polysilicon film PSI through scanning with the laser beam SXL as shown in FIG. 17A, the crystal structure of the quasi-strip-like-crystal silicon film SPSI is obtained in which the single crystals reside in strips extending in the direction of scanning with the laser beam as shown in FIG. 17B. The reference numeral CB represents a crystal boundary.

The average grain size of the single crystals in the quasi-strip-like-crystal silicon films SPSI is about 5 μm in the direction of scanning with the laser beam SXL and about 0.5 μm (the width between the crystal boundaries CB) in a direction orthogonal to the scanning direction. The grain size in the scanning direction can be varied by changing conditions including the energy of the laser beam SXL, the scanning speed, and the pulse width. By contrast, the average grain diameter in the polysilicon film PSI is about 0.6 μm (0.3 to 1.2 μm). Such a difference in crystal structure provides greatly different electron mobilities when the thin-film transistors are constructed by using the polysilicon film PSI and the quasi-strip-like-crystal silicon film SPSI.

The quasi-strip-like-crystal silicon film SPSI described above has such characteristics that:

(a) the main orientation in the surface is the {110} orientation; and (b) the main orientation in a plane substantially perpendicular to the carrier moving direction is the {100} orientation.

The two orientations in the foregoing (a) and (b) can be evaluated by electron beam diffraction or by EBSP (Electron Backscatter Diffraction Pattern). Other characteristics are such that:

(c) the density of defects in the film is lower than $1 \times 10^{17}$ cm$^{-3}$. The number of crystal defects in the film is a value defined by electric characteristics or through quantitative evaluation of unpaired electrons by electron spin resonance (ESR);

(d) the hole mobility in the film is 50 cm$^2$/Vs or more and 700 cm$^2$/Vs or less;

(e) the thermal conductivity of the film has temperature dependence and shows a maximum value at a certain temperature. If the temperature rises, the thermal conductivity increases temporarily to show a maximum value not less than 50 W/mK and not more than 100 W/mK. In the high temperature region, the thermal conductivity decreases as the temperature rises. The thermal conductivity is a value evaluated and defined by the 3-omega method or the like. Still other characteristics are such that:

[76]

(f) the Raman shift in the thin film evaluated and defined by Raman scattering spectroscopy is not less than 512 cm$^{-1}$ and not more than 518 cm$^{-1}$; and (g) the distribution of Σ values in the crystal boundary of the film has a maximum value at Σ11 and shows a Gaussian configuration. The Σ values are measured by electron beam diffraction or by EBSP (Electron Backscatter Diffraction Pattern). Yet another characteristic is such that:

(h) the optical constants of the film are characterized in that they are in ranges satisfying the following requirements: The reflectivity n at a wavelength of 500 nm is not less than 2.0 and not more than 4.0 and the attenuation factor k is not less than 0.3 and not more than 1; and the reflectivity n at a wavelength of 300 nm is not less than 3.0 and not more than 4.0 and the attenuation factor k is not less than 3.5 and not more than 4. The optical constants are values measured by using a spectroscopic ellipsometer.

Figure 18A:
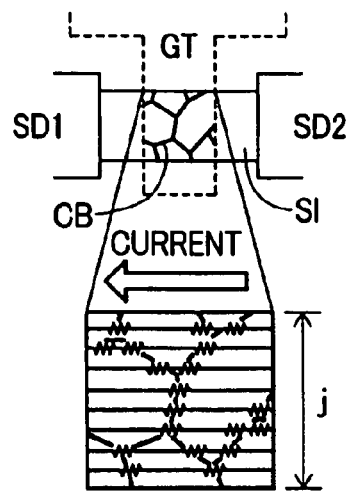
FIGS. 18A and 18B are views illustrating different electron mobilities in the channel of a thin-film transistor resulting from different crystal structures of the silicon film.
Figure 18B:
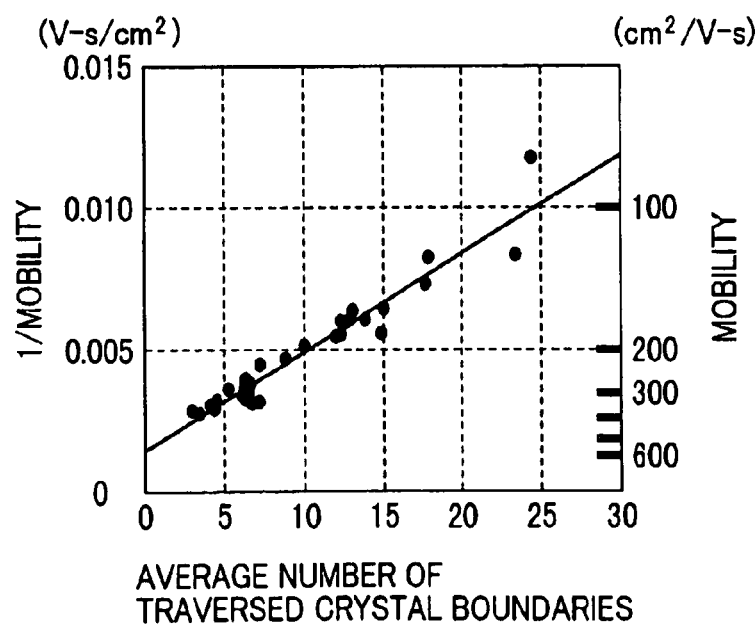

FIGS. 18A and 18B are views illustrating the different electron mobilities in the channel of the thin-film transistor resulting from the different crystal structures of the silicon films, of which FIG. 18A shows the relations among the channel structure of the thin-film transistor, the crystal boundary CB in the silicon film SI on the channel portion, and the electron mobility and FIG. 18B shows the relationship between the number of crystal boundaries traversed by a current flowing between the source SD1 and the drain SD2 and the electron mobility. If the silicon film SI is a polysilicon film PSI, the current from the drain SD2 to the source SD1 traverses a larger number of crystal boundaries. If the silicon film SI is a quasi-strip-like-crystal silicon film SPS1, a large single crystal resides in an extended configuration in the direction of growth and the current traverses a smaller number of crystal boundaries. The relations are shown in FIG. 18B.

An average number of traversed crystal boundaries is represented by C=ΣNi/j where j is a number by which the width of the channel is divided in the direction of the current and Ni is the number of traversed crystal boundaries in the direction of the current flow. In FIG. 18B, the average number of traversed crystal boundaries is represented as abscissa and the electron mobility (cm$^2$/Vs) and the reciprocal (Vs/cm$^2$) thereof are represented as ordinate. By thus disposing the source SD1 and the drain SD2 such that the current flows in the direction of the crystal growth in the quasi-strip-like-crystal silicon film SPSI composing the channel of the thin-film transistor, the electron mobility is extremely increased. In other words, the operating speed of the thin-film transistor is increased. This allows precise formation of the thin-film transistor and the lines R1, G1, B1, R2, G2, and B2 can be formed with a pitch smaller than the pixel pitch, as shown in FIG. 3. As a result, a large space is formed between circuits formed by using the virtual tiles. It is also possible to use the space as a space for forming another line or the like.

Figure 19:
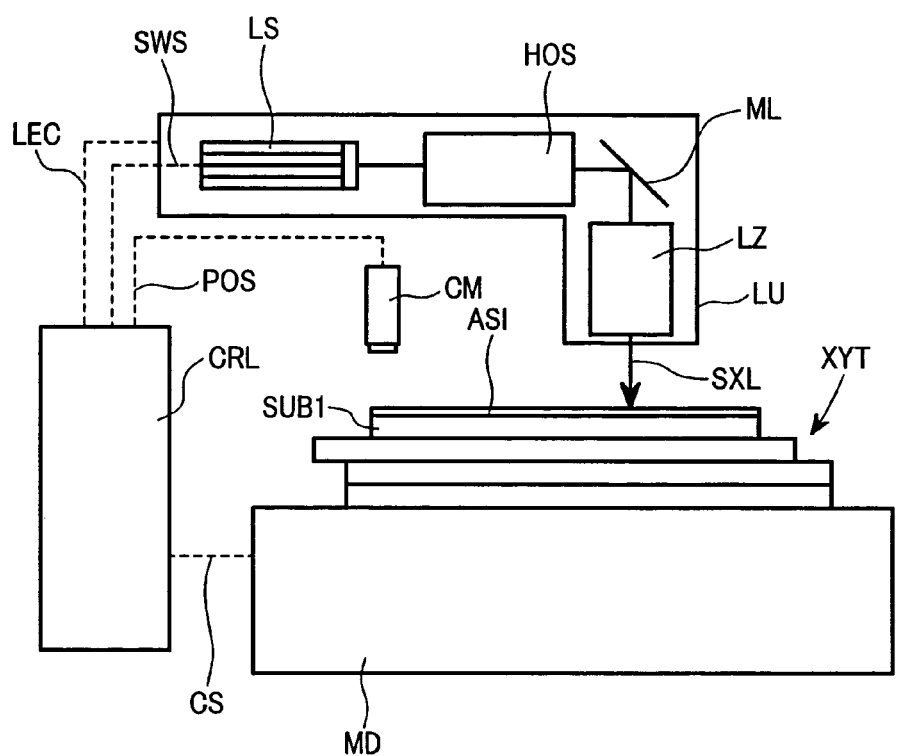
FIG. 19 is a structural view illustrating an example of an apparatus for laser beam irradiation.

FIG. 19 is a structural view illustrating an example of an apparatus for laser beam irradiation. In the irradiation apparatus, the glass substrate SUB1 formed with the polysilicon film PSI is placed on a drive stage XYT movable in x-y directions and positioning is performed by using a camera CM for reference position measurement. A reference position measurement signal POS is inputted to a control unit CRL and the irradiation position is adjusted finely based on a control signal CS inputted to drive equipment MD. Unidirectional scanning (the x direction in FIG. 1) is performed by moving the stage XYT at a specified speed. In synchronization with the scanning, the laser beam SXL is emitted from irradiation equipment LU to irradiate the polysilicon film PSI, thereby reforming it into the quasi-strip-like-crystal silicon film SPSI.

By disposing, in the irradiation equipment LU, an oscillator for continuous-wave (CW) solid-state laser LS (Laser Diode) excitation, a homogenizer, an optical system HOS such as an EO modulator for pulse width modulation, a reflecting mirror ML, and a focusing lens system LZ, by way of example, a desired irradiation beam can be formed. The irradiation time, intensity, and the like of the laser beam SXL are adjusted with an ON-OFF signal SWS and a control signal LEC from the control unit CRL.

Figure 20:
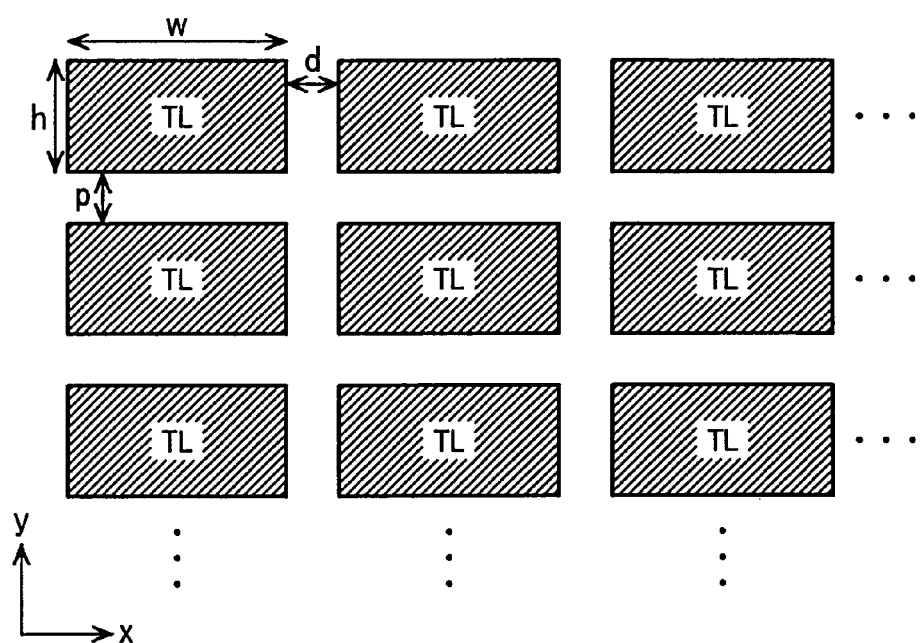
FIG. 20 is a plan view illustrating an example of the layout of the virtual tiles.

FIG. 20 is a plan view for illustrating an example of the layout of the virtual tiles. In the example of arrangement, the virtual tiles TL are arranged in a plurality of rows in the drive circuit region DAR1 described with reference to FIG. 1. The virtual tiles TL can be arranged in a single row, two or more multiple rows, or in a staggered configuration in accordance with a pulse for a circuit to be formed. In the present example, the virtual tiles TL are arranged in three rows (or three stages). The size of each of the virtual tiles TL is such that the length w thereof in the x direction is not less than 20 μm and not more than 1 mm, the width h thereof in the y direction is not less than 20 μm and not more than 1 mm, the spacing d between the two tiles adjacent in the x direction is not less than 3 μm, and the spacing p between the two tiles adjacent in the y direction is not less than 3 μm. The arrangement size is limited by the power of the laser and a size which allows stable growth of a high-quality crystal.

Figure 21:
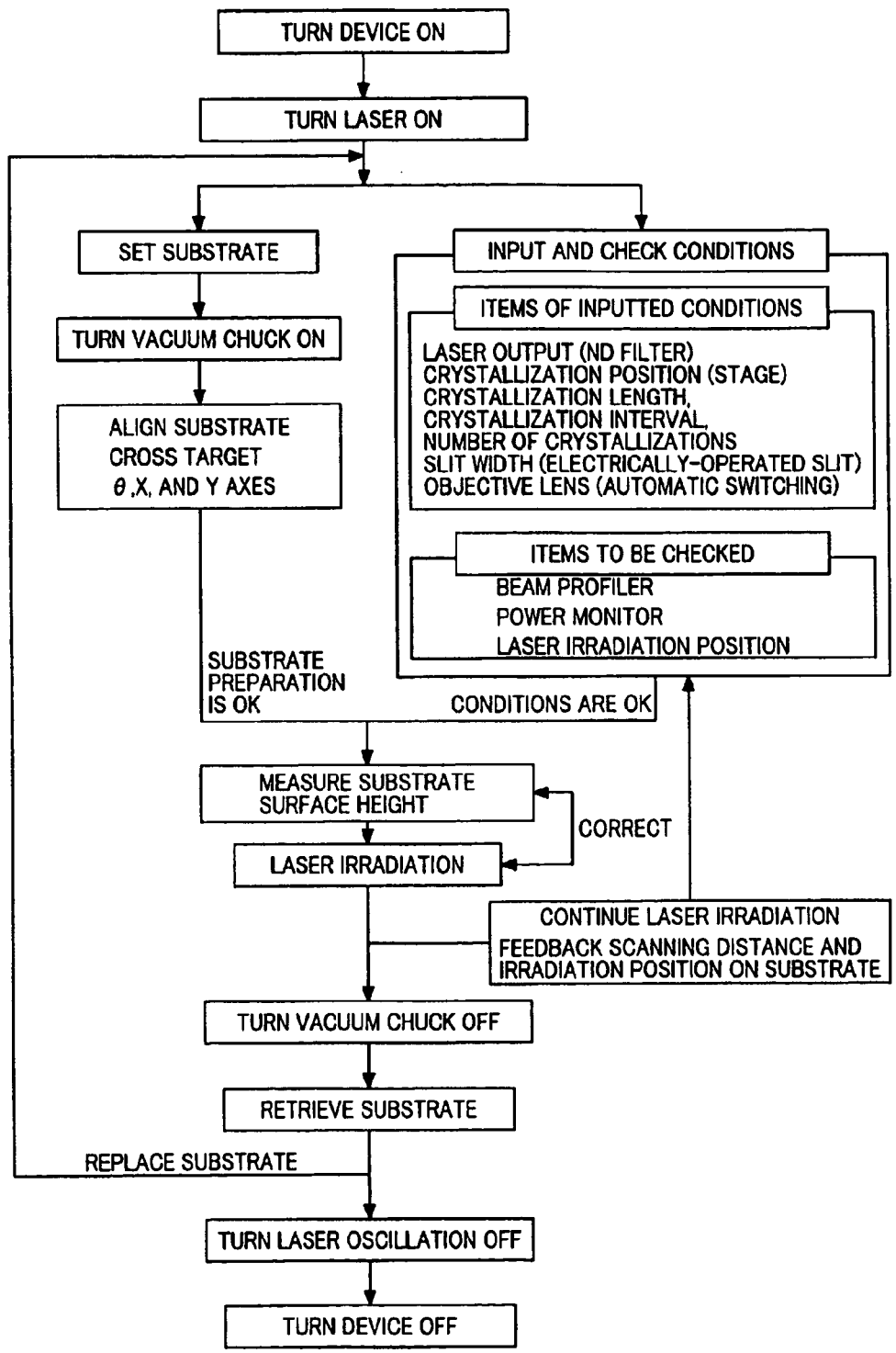
FIG. 21 is a view illustrating an example of a laser irradiation process using the irradiation apparatus of FIG. 19.

FIG. 21 is a view illustrating an example of a laser irradiation process using the irradiation apparatus of FIG. 19. In FIG. 21, the insulating substrate is simply denoted as a substrate. First, a power supply for the apparatus is turned ON to irradiate the insulating substrate formed with the polysilicon film with the laser beam SXL and the laser is turned ON. The insulating substrate is placed on the drive stage XYT and fixed by using a vacuum chuck. By using the positioning mark on the insulating substrate as the target, an X-axis, a Y-axis, and a θ-axis (the direction of rotation in an X-Y plane) are adjusted to specified values, whereby the preparation of the insulating substrate is completed.

Meanwhile, various conditions are inputted to the irradiation apparatus and checked. Items of inputted conditions include a laser output (adjustment of an ND filter and the like), setting of a crystallization position (on the drive stage XYT), a crystallization length (the length of each of the virtual tiles in the growth direction of a crystal), a crystallization interval (the interval between the virtual tiles), the number of crystallizations (the number of the virtual tiles to be produced), the adjustment of the width of a slit on a laser beam path, and the setting of an objective lens. The crystallization distance, the crystallization interval, and the number of crystallizations are set to the EO modulator. Items to be checked include a beam profiler for the laser beam, a power monitor, and the position of laser beam irradiation.

After the preparation of the insulating substrate is completed and the conditions are inputted and checked, the surface height of the insulating substrate is measured and laser beam irradiation is performed by operating an auto focus mechanism. The auto focus mechanism is corrected by the laser beam irradiation so that the surface height of the insulating substrate is controlled. While the laser beam irradiation is continued, the scanning distance and the irradiation position on the insulating substrate are fed back to the condition input side.

After the laser beam irradiation process to a specified region is completed, the vacuum chuck is turned OFF and the insulating substrate is retrieved from the drive stage XYT. Then, a next insulating substrate is placed on the drive stage XYT and the foregoing operation is repeated a required number of times. When the required laser irradiation processes to the insulating substrates is entirely completed, the laser oscillator is turned OFF and the power supply for the apparatus is turned OFF, whereby the laser irradiation process is completed.

Figure 22:
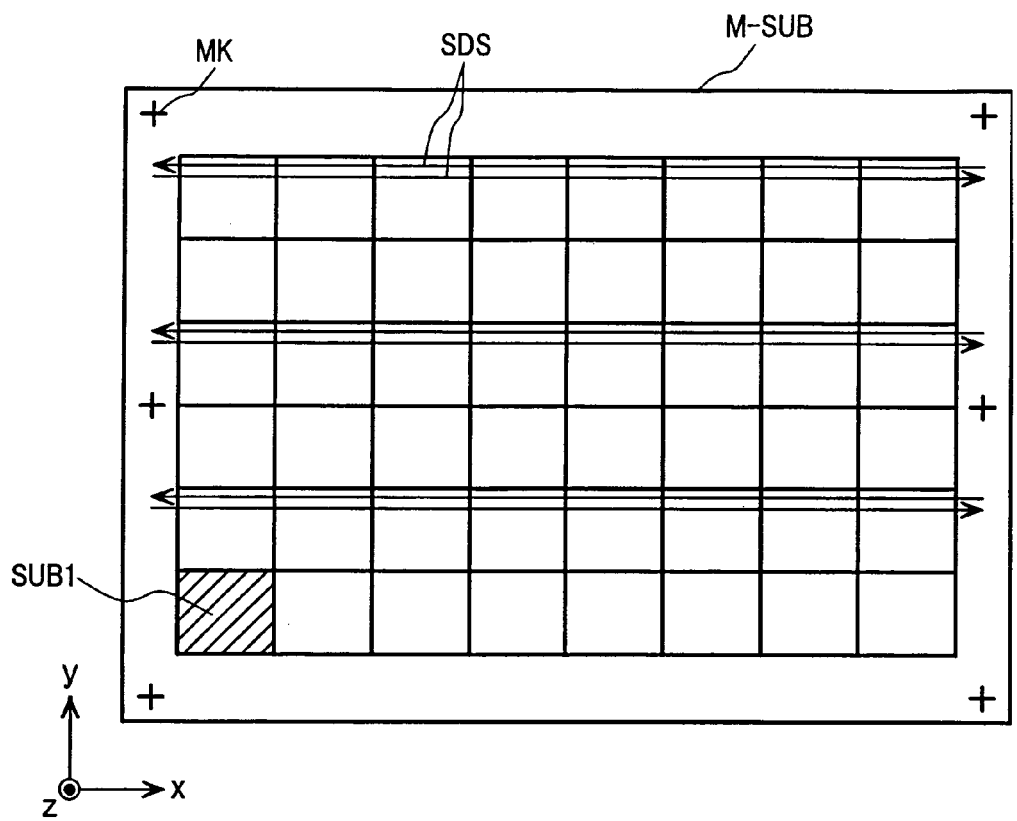
FIG. 22 is a view illustrating an operation of forming the virtual tiles composed of a quasi-strip-like-crystal silicon film SPSI, which is performed to each of the individual insulating substrates of a multiple large-sized mass insulating substrate.

FIG. 22 is a view illustrating the operation of forming the virtual tiles from the quasi-strip-like-crystal silicon films SPSI, which is performed to each of the individual insulating substrates of a multiple large sized mass insulating substrate. In FIG. 22, the reference numeral M-SUB denotes the large-sized mass insulating substrate formed with the large number of active matrix substrates SUB1 of individual image display devices. Although the total number of individual insulating substrates shown herein is 8×6=48, it will easily be appreciated that the number of individual insulating substrates is not limited thereto. After positioning is performed relative to the drive circuit region on the large-sized mass insulating substrate M-SUB by using the mark MK as the target, reciprocal scanning with the laser beam is performed as indicated by the arrow SDS in the drawing. Short-time formation of the required virtual tiles in the large-sized mass insulating substrate M-SUN is enabled herein by performing scanning with three laser beams in parallel with each other.

Figure 23A:
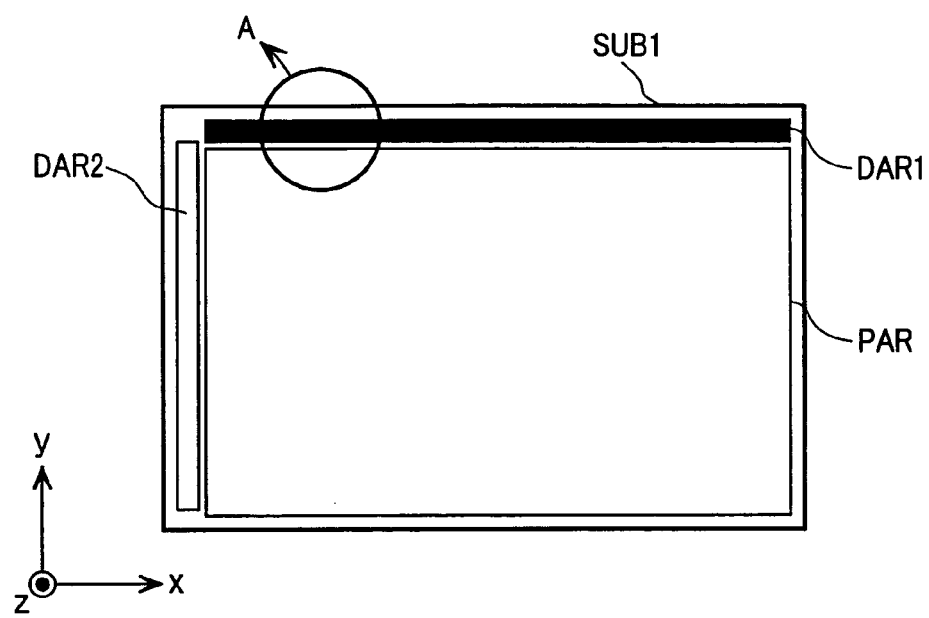
FIGS. 23A and 23B are plan views of an active matrix substrate for illustrating an example of the positions of the virtual tiles formed in FIG. 22.
Figure 23B:
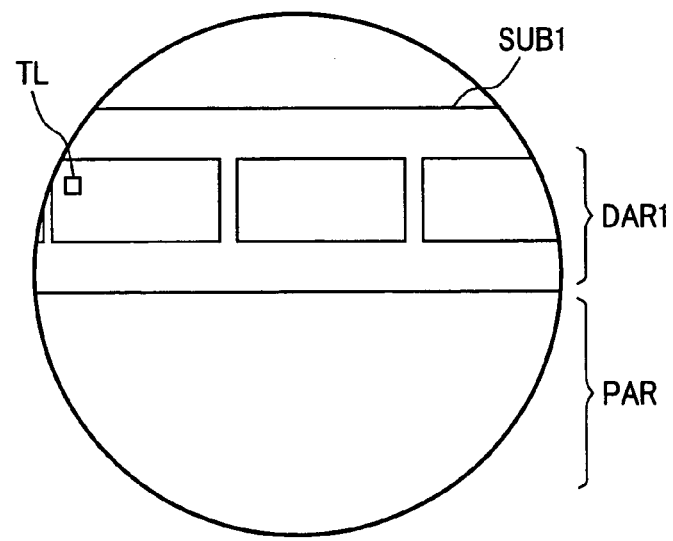

FIGS. 23A and 23B are plan views of an active matrix substrate illustrating an example of the positions of the virtual tiles formed in FIG. 22, of which FIG. 23A is an overall view and FIG. 23B is an enlarged view of the portion indicated by the arrow A. In this example, the blocks of a plurality of virtual tiles TL are arranged in one row along one side in the x direction of the drive circuit region DAR1 for data signal of the active matrix substrate SUB1. In this case, the plurality of virtual tiles are provided in the entire region indicated by the reference numeral SX in FIG. 2 or 9 or in the sampling circuit portion SAMP of FIG. 2, the portion of each of the latch circuits LT1 and LT2 of FIG. 9, in the portion of the digital-analog converter DAC, and in the portion of the buffer circuit BA and disposed in divided relation in blocks. The individual reformed regions composing the virtual tiles are similarly disposed. It is to be noted that the sizes and positions of the blocks of the virtual tiles and the individual reformed regions of FIG. 23B are shown differently from the sizes and positions of the actual circuits for easy understanding of the present invention.

Figure 24A:
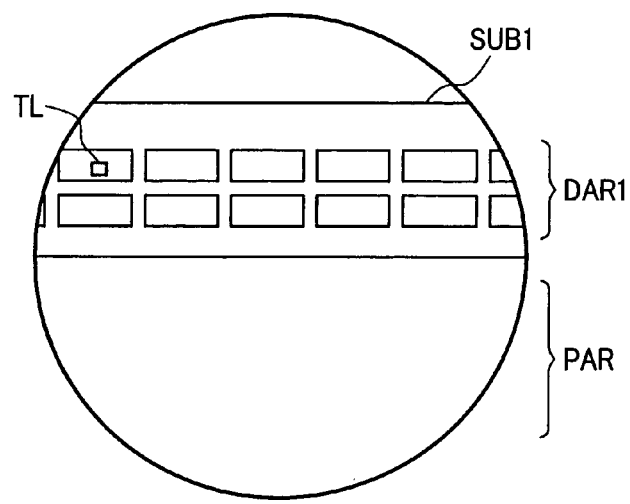
FIGS. 24A and 24B are enlarged views for illustrating other arrangements of the virtual tiles, which are similar to FIG. 23B.
Figure 24B:
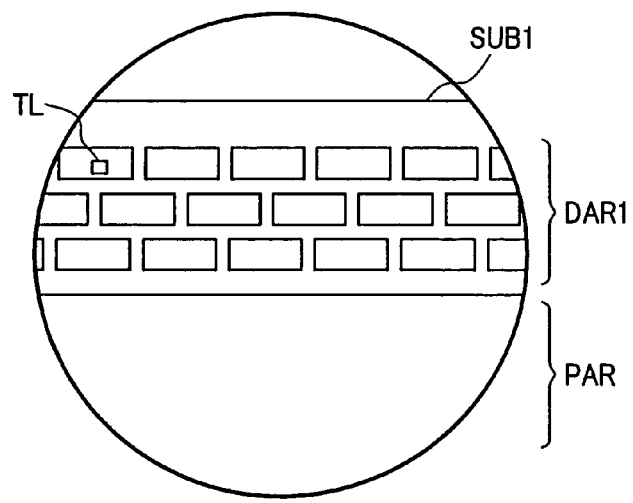

FIGS. 24A and 24B are enlarged views illustrating other arrangements of the virtual tiles, similar to FIG. 23B. The blocks of the virtual tiles TL are arranged in two rows parallel to the x direction, as shown in FIG. 24A, or arranged in three rows which are parallel with the x direction in staggered relation. The sizes and spacing of the blocks can be varied in accordance with a circuit structure in use. The individual reformed regions composing the blocks can also be arranged in a plurality of rows or in staggered relation.

Figure 25:
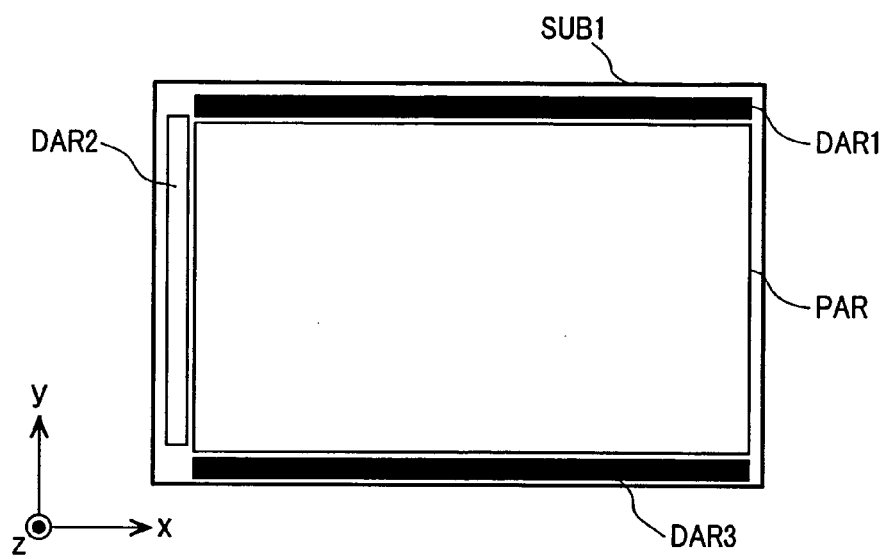
FIG. 25 is a plan view of an active matrix substrate for illustrating another example of the positions of the virtual tiles.
Figure 26:
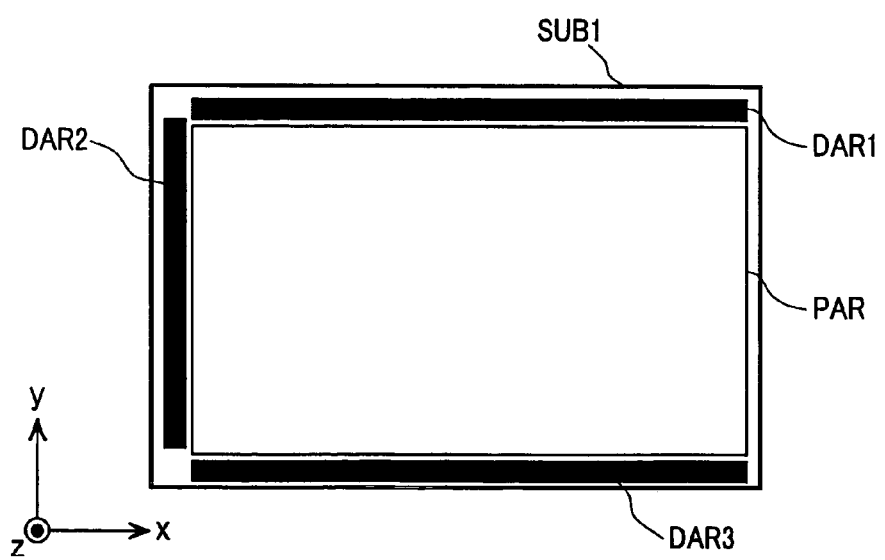
FIG. 26 is a plan view of an active material substrate for illustrating still another example of the positions of the virtual tiles.

FIGS. 25 and 26 are plan views of an active matrix substrate illustrating other examples of the positions of the virtual tiles. In FIG. 25, the virtual tiles are applied to the drive circuit regions DAR1 and DAR3 described with reference to FIG. 1. In FIG. 26, the virtual tiles are applied to the drive circuit regions DAR1 and DAR3 described with reference to FIG. 1 and to the scan drive circuit region DAR2 formed along one side of the active matrix substrate SUB1 extending in the y direction. The arrangement and the like of the individual virtual tiles and blocks are the same as those described with reference to FIGS. 23A to 24B.

A description will be given next to the positioning mark for forming the virtual tiles on the insulating substrate (active matrix substrate). FIGS. 27P-1, 27P-2, and 27P-3 are views illustrating a first example of a positioning mark formed on an active matrix substrate SUB1 and the laser irradiation process using the mark as the target. In this example, the positioning mark MK is formed by photolithography on a silicon film SI formed on the active matrix substrate SUB1 (P-1) and positioning (alignment) is performed by using the mark MK as a reference during the subsequent irradiation with a continuous pulse laser SLX (P-2). Then, the quasi-strip-like-crystal silicon film SPSI resulting from reformation through irradiation with the continuous pulse laser SLX is processed into islands SPSI-L (P-3) by similarly using the mark MK as a reference. The mark MK may also be formed in the stage of an amorphous silicon film ASI or in the stage of a polysilicon film.

FIGS. 28P-1, 28P-2, and 28P-3 are views illustrating a second example of the positioning mark formed on the active matrix substrate SUB1 and the laser beam irradiation process using the mark as the target. In this example, after the polysilicon film PSI is formed on the active matrix substrate SUB1 (P-1), the positioning mark MK is formed with the laser SLX when the polysilicon film PSI is irradiated with the laser SLX (P-2). During the subsequent formation of the islands SPSI-L, positioning is performed by using the mark MK (P-3).

The polysilicon film PSI and the quasi-strip-like-crystal silicon film SPSI have different reflectivities for visible light. The difference in reflectivity can be used as a positioning target. In addition, the polysilicon film PSI and the quasi-strip-like-crystal silicon film SPSI have different heights resulting from the sizes of the crystals. It is also possible to use a difference in level in the crystal grain of a portion corresponding to the mark MK reformed into a quasi-strip-like crystal. It is also possible to remove the portion of the polysilicon film corresponding to the mark MK by laser abrasion to form the mark MK. The method for forming the mark MK by laser abrasion is advantageous in that the photolithographic step for forming the mark MK can be omitted.

FIGS. 29P-1, 29P-2, and 29P-3 are views illustrating a third example of the positioning mark formed on the active matrix substrate SUB1 and the laser beam irradiation process using the mark as the target. In this example, the glass substrate or an underlying film is preliminarily formed with the mark MK by etching or by mechanical means (P-1) before the silicon film is formed on the active matrix substrate SUB1. The active matrix substrate SUB1 is then formed with the polysilicon film PSI and irradiation with the laser beam SLX is performed by using the mark MK as a reference, thereby forming the quasi-strip-like-crystal silicon film SPSI (P-2). During the subsequent formation of the islands SPSI-L, positioning is performed by using the mark MK (P-3)

Thus, according to the present embodiment, the polysilicon film is reformed into larger crystals and the probability that a current between the source and drain traverses crystal boundaries can be reduced through the orientation of the direction of crystal growth. This improves the operating speed of the thin-film transistor, allows the formation of an optimal thin-film transistor circuit, and allows the placement of thin-film transistor circuits using semiconductor films of quasi-strip-like-crystal silicon films at the drive circuit portions of an image display device. The performance of the thin-film transistor obtained in the present embodiment is such that, if an N-channel MIS transistor is to be produced, a field effect mobility is about 300 $cm^2/Vs$ or more and variations in threshold voltage can be reduced to 0.2 V or less. Consequently, a high-performance display device using an active matrix substrate which operates with high reliability and features excellent device-to-device uniformity can be fabricated.

The present embodiment can also fabricate a P-channel MIS transistor by boron implantation which provides holes and carriers instead of phosphorus ion implantation which provides electrons and carriers. In the foregoing CMOS circuit, an improvement in frequency characteristic is expected suitably for high-speed operation.

Figure 30:
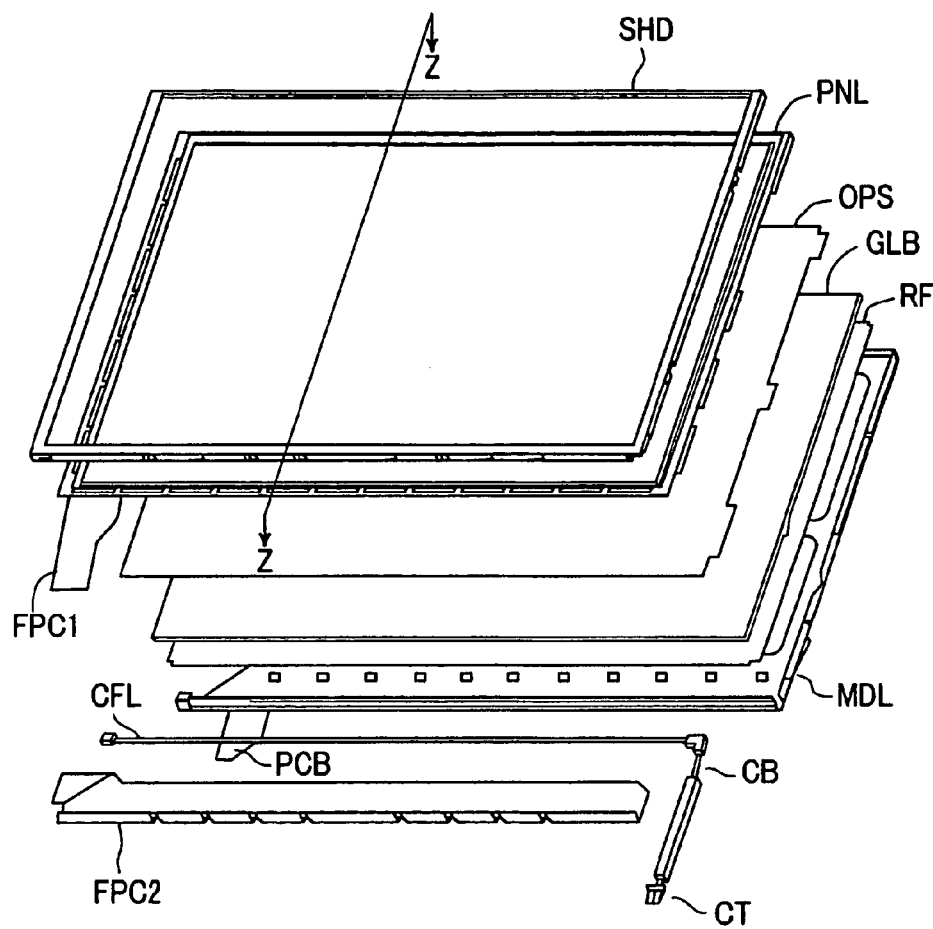
FIG. 30 is a developed perspective view illustrating a structure of a liquid crystal display device as a first example of the image display device according to the present invention.
Figure 31:
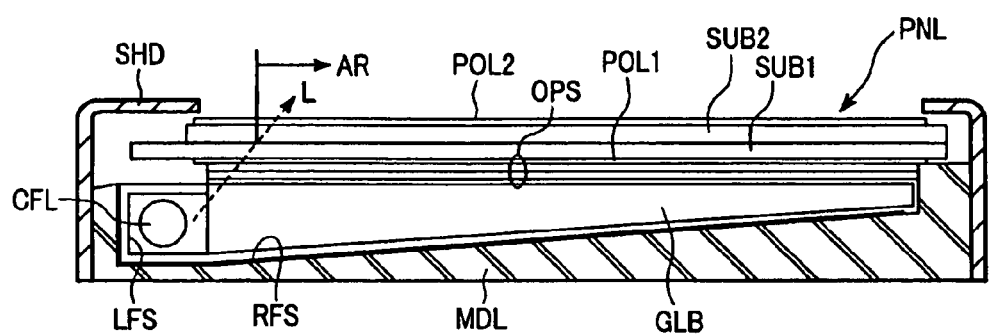
FIG. 31 is a cross-sectional view taken along the line Z—Z of FIG. 30.

FIG. 30 is a developed perspective view showing a structure of a liquid crystal display device as a first example of the image display device according to the present invention. FIG. 31 is a cross-sectional view taken along the line Z—Z of FIG. 30. The liquid crystal display device is fabricated by using the active matrix substrate described above. In FIGS. 30 and 31, the reference numeral PNL denotes a liquid crystal cell obtained by bonding the color filter substrate SUB2 to the active matrix substrate SUB1 and sealing a liquid crystal into the space therebetween. Polarizing plates POL1 and POL2 are stacked on the top and back surfaces of the liquid crystal cell PNL. The reference numeral OPS denotes an optical compensation members GLB denotes a beam guiding plate, CFL denotes a cold cathode fluorescent lamp, RFS denotes a reflection sheet, LFS denotes a lamp reflection sheet, SHD denotes a shield frame, and MDL denotes a mold case.

A liquid crystal orientation film layer is formed on the active matrix substrate SUB1 having any of the structures according to the foregoing embodiments and an orientation control force is imparted thereto by a technique such as rubbing. After a sealer is formed on the periphery of the pixel region AR, the color filter substrate SUB2 similarly formed with an orientation film layer is disposed in opposing relation to the active matrix substrate SUB1 with a specified gap held therebetween. The liquid crystal is sealed in the gap and an injection hole for sealer is closed with a sealing member. The polarizing plates POLL and POL2 are stacked on the top and back surfaces of the liquid crystal cell PNL thus constructed and a backlight composed of the beam guiding plate GLB, the cold cathode fluorescent lamp CFL, and the like is mounted via the optical compensation member OPS, whereby the liquid crystal display device is fabricated. A data signal and a timing signal are supplied to a drive circuit provided on the periphery of the liquid crystal cell via flexible printed boards FPC1 and FPC2. Between an external signal source and each of the flexible printed board FPC1 and FPC2, a timing converter for converting a display signal inputted from the external signal source to a signal form displayed on the liquid crystal display device and the like are mounted on a printed circuit board designated by the reference numeral PCB.

The liquid crystal display device using the active matrix substrate according to the present embodiment is suitable for a high-speed operation since it has an excellent current driving ability with the excellent polysilicon thin-film transistor circuit being disposed in the pixel circuit thereof. The present embodiment also offers an advantage of providing a liquid crystal display device which is uniform in image quality due to reduced variations in threshold voltage.

Figure 32:
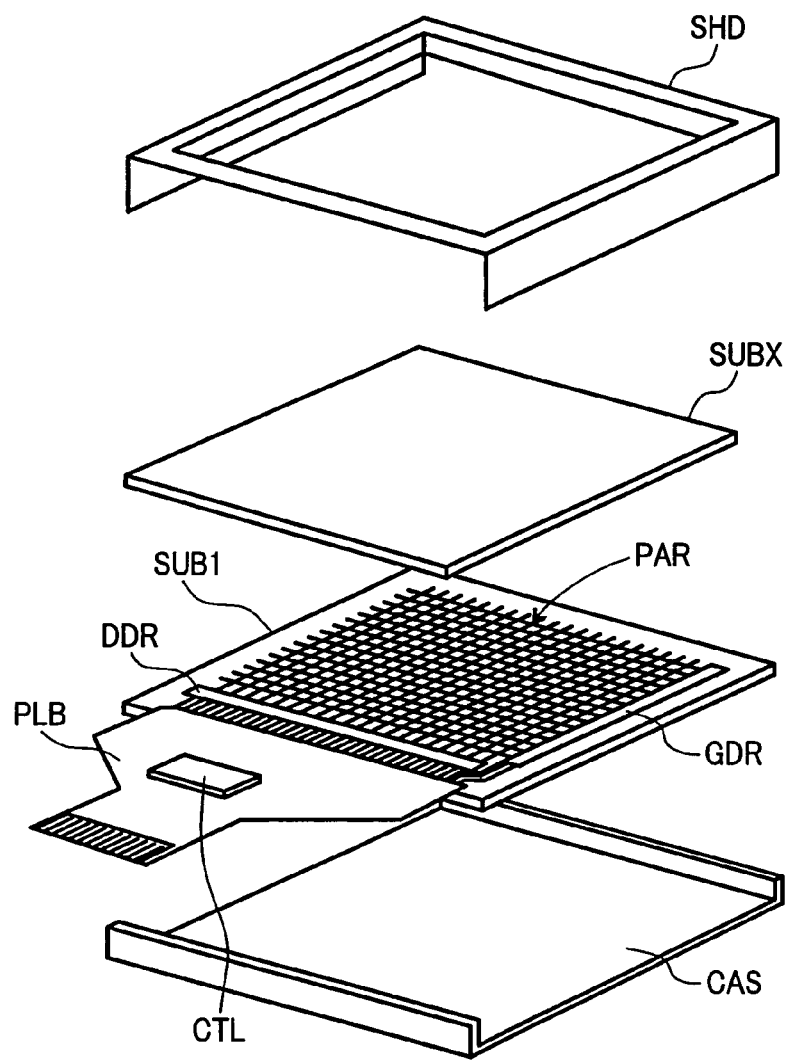
FIG. 32 is a developed perspective view illustrating an exemplary structure of an organic EL display device as a second example of the image display device according to the present invention.
Figure 33:
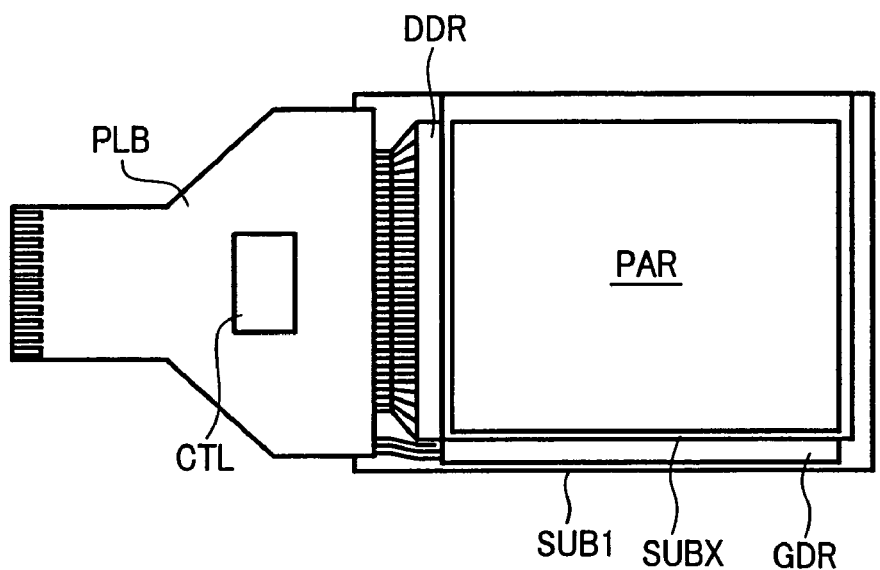
FIG. 33 is a plan view of an organic EL display device into which the components shown in FIG. 32 have been incorporated.
Figure 34A:
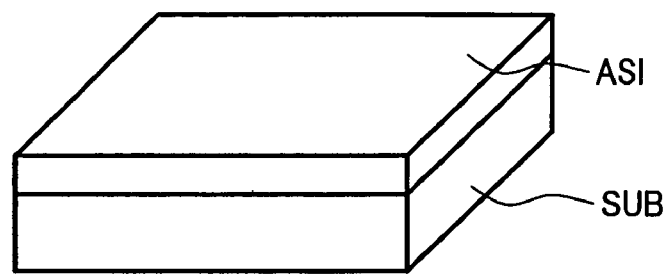
FIGS. 34A and 34B are views each illustrating a common method for crystallizing an amorphous silicon film through scanning and irradiation with an excimer pulse laser beam.
Figure 34B:
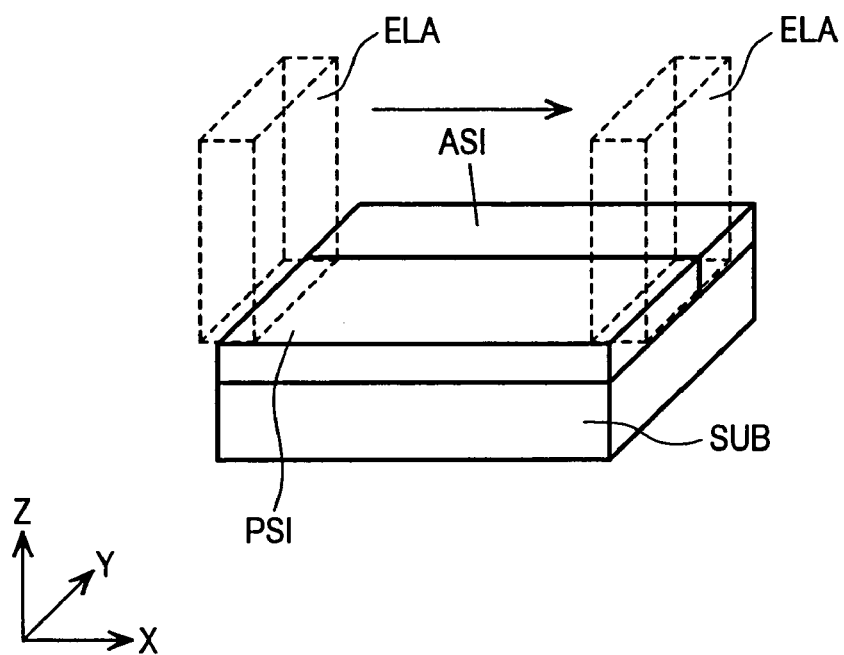
Figure 35A:
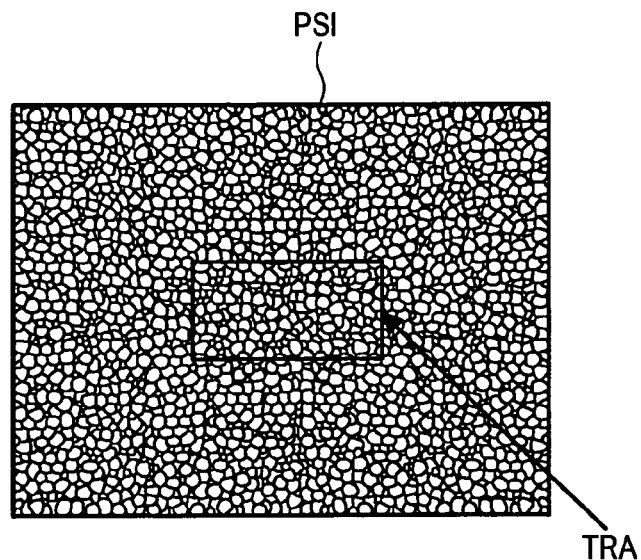
FIGS. 35A and 35B are a partial plan view of a portion irradiated with the laser beam in FIG. 34 and a plan view of a principal portion of a thin-film transistor for illustrating an exemplary structure thereof.
Figure 35B:
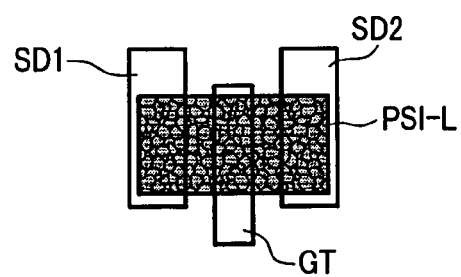

An organic EL display device can also be fabricated by using the active matrix substrate according to the present embodiment. FIG. 32 is a developed perspective view illustrating an exemplary structure of the organic EL display device as a second example of the image display device according to the present invention. FIG. 33 is a plan view of the organic EL display device obtained by integrating the components shown in FIG. 32 into one body. An organic EL element is formed on a pixel electrode provided on any of the active matrix substrates SUB1 according to the foregoing individual embodiments. The organic EL element is composed of a multilayer structure consisting of a hole transport layer, a light-emitting layer, an electron transport layer, a cathode metal layer, and the like which are vapor deposited successively on a surface of the pixel electrode. A sealer is disposed on the periphery of the pixel region PAR of the active matrix substrate SUB1 formed with such a multilayer structure and sealing is performed by using a sealing substrate SUBX or a sealing can.

In the organic EL display device, a display signal is supplied from an external signal source to a drive circuit region DDL with a printed board PLB. An interface circuit chip CTL is mounted on the printed board PLB. Integration is performed by using a shield frame SHD as an upper case and a lower case CAS to form the organic EL display device.

Since the organic EL element operates in a current-driven light-emitting mode in active matrix driving for the organic EL display device, the use of a high-performance pixel circuit is essential to the provision of a high-quality image so that a pixel circuit of a CMOS thin-film transistor is used desirably. A thin-film transistor circuit formed in a drive circuit region is also essential to the achievement of a high speed and a high definition. The active matrix substrate SUB1 according to the present embodiment has high performance satisfying these requirements. The organic EL display device using the active matrix substrate fabricated by the fabrication method according to the present invention is one of display devices which maximally achieve the advantages of the present embodiment.

The fabrication method according to the present invention is neither limited to the fabrication of the active matrix substrates of the foregoing image display devices nor limited to the fabrication of the structures recited in claims and described in the embodiments. Various changes and modifications may be made without departing from the technical idea of the present invention. For example, the fabrication method according to the present invention is also applicable to the fabrication of various semiconductor devices.

What is claimed is:

1. A method for fabricating an image display device comprising steps of:
   forming a semiconductor film over an insulating substrate;
   forming a quasi-strip-like crystal having a semiconductor crystal grown in a quasi-strip-like shape at a plurality of portions of said semiconductor film by scanning and irradiating a laser beam of a continuous-wave laser to said semiconductor film;
   forming a thin film transistor including said quasi-strip-like crystal; and
   dividing said insulating substrate into a plurality of active matrix substrates each constituting an image display device by cutting said insulating substrate without crossing said portions where said laser beam of said continuous-wave laser is irradiated.

2. A method for fabricating an image display device according to claim 1, wherein scanning and irradiating said laser beam of said continuous-wave laser is performed by moving said insulating substrate.

3. A method for fabricating an image display device according to claim 1, wherein said semiconductor film includes silicon.

4. A method for fabricating an image display device according to claim 1, wherein said dividing step involves scanning and modulating said laser beam emitted from said continuous-wave laser into a pulse modulated laser beam.

5. A method for fabricating an image display device according to claim 1, wherein scanning with a plurality of said laser beams in parallel with each other is performed.

6. A method for fabricating an image display device according to claim 1, wherein irradiating said laser beam of said continuous-wave laser to said semiconductor film is performed before patterning said semiconductor film.

7. A method for fabricating an image display device according to claim 1, wherein said step of forming said semiconductor film over said insulating substrate involves forming an amorphous semiconductor film.

8. A method for fabricating an image display device according to claim 1, wherein said step of forming said semiconductor film over said insulating substrate involves forming a polycrystalline semiconductor film.

9. A method for fabricating an image display device according to claim 1, further comprising a step of forming a positioning mark by irradiating said continuous wave laser to said semiconductor film.

10. A method for fabricating an image display device according to claim 9, wherein positioning is performed by using said positioning mark when patterning said semiconductor film in which said quasi-strip-like crystal is formed.

11. A method for fabricating an image display device according to claim 1, further comprising a step of forming a positioning mark by irradiating said pseudo continuous-wave laser to said semiconductor film.

12. A method for fabricating an image display device according to claim 11, wherein positioning is performed by using said positioning mark when patterning said semiconductor film in which said quasi-strip-like crystal is formed.

13. A method for fabricating an image display device according to claim 1, wherein reciprocal scanning with said laser beam is performed.

14. A method for fabricating an image display device comprising steps of:
   forming a semiconductor film over an insulating substrate:
   forming a quasi-strip-like crystal having a semiconductor crystal grown in a quasi-strip-like shape at a plurality of portions of said semiconductor film by scanning and irradiating a laser beam of a continuous-wave laser or a pseudo continuous-wave laser to said semiconductor film;
   forming a thin film transistor including said quasi-strip-like crystal; and
   dividing said insulating substrate into a plurality of active matrix substrates by cutting said insulating substrate without crossing said portions where said laser beam of said continuous-wave laser or said pseudo continuous-wave laser is irradiated,
   wherein reciprocal scanning with said laser beam is performed.

15. A method for fabricating an image display device comprising steps of:
- forming a semiconductor film over an insulating substrate;
- forming a quasi-strip-like crystal having a semiconductor crystal grown in a quasi-strip-like shape at a plurality of portions of said semiconductor film by scanning and irradiating a laser beam of a pseudo continuous-wave laser to said semiconductor film;
- forming a thin film transistor including said quasi-strip-like crystal; and
- dividing said insulating substrate into a plurality of active matrix substrates each constituting an image display device by cutting said insulating substrate without crossing said portions where said laser beam of said pseudo continuous-wave laser is irradiated.

16. A method for fabricating an image display device according to claim 15, wherein scanning and irradiating said laser beam of said pseudo continuous-wave laser is performed by moving said insulating substrate.

17. A method for fabricating an image display device according to claim 15, wherein said semiconductor film includes silicon.

18. A method for fabricating an image display device according to claim 15, wherein said dividing step involves scanning and modulating said laser beam emitted from said pseudo continuous-wave laser into a pulse modulated laser beam.

19. A method for fabricating an image display device according to claim 15, wherein reciprocal scanning with said laser beam is performed.

20. A method for fabricating an image display device according to claim 15, wherein scanning with a plurality of said laser beams in parallel with each other is performed.

21. A method for fabricating an image display device according to claim 15, wherein irradiating said laser beam of said pseudo continuous-wave laser to said semiconductor film is performed before patterning said semiconductor film.

22. A method for fabricating an image display device according to claim 15, wherein said step of forming said semiconductor film over said insulating substrate involves forming an amorphous semiconductor film.

23. A method for fabricating an image display device according to claim 15, wherein said step of forming said semiconductor film over said insulating substrate involves forming a polycrystalline semiconductor film.

* * * * *